United States Patent
Lee et al.

(10) Patent No.: US 11,457,537 B2
(45) Date of Patent: Sep. 27, 2022

(54) ELECTRONIC DEVICE INCLUDING DISPLAY

(71) Applicant: SAMSUNG ELECTRONICS CO., LTD., Suwon-si (KR)

(72) Inventors: Yongseok Lee, Suwon-si (KR); Gyeongtae Kim, Suwon-si (KR); Sunggun Cho, Suwon-si (KR); Seunghyun Hwang, Suwon-si (KR); Daehyeong Park, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 120 days.

(21) Appl. No.: 16/898,769

(22) Filed: Jun. 11, 2020

(65) Prior Publication Data

US 2020/0413559 A1    Dec. 31, 2020

(30) Foreign Application Priority Data

Jun. 26, 2019  (KR) .................. 10-2019-0076492

(51) Int. Cl.
  *H05K 1/18*  (2006.01)
  *H05K 5/06*  (2006.01)
  (Continued)

(52) U.S. Cl.
  CPC ............ *H05K 5/062* (2013.01); *H05K 1/189* (2013.01); *H05K 5/0017* (2013.01); *H01R 12/61* (2013.01); *H05K 2201/10128* (2013.01)

(58) Field of Classification Search
  CPC .... G06F 1/1637; G06F 1/1656; G06F 1/1686; G06F 1/1628; H04M 1/0266;
  (Continued)

(56) References Cited

U.S. PATENT DOCUMENTS

| 9,872,408 B2 | 1/2018 | Choi et al. |
| 2011/0194063 A1* | 8/2011 | Lee .................. H05B 33/10 |
| | | 313/504 |

(Continued)

FOREIGN PATENT DOCUMENTS

| CN | 206162451 U | 5/2017 |
| EP | 3 151 524 A1 | 4/2017 |

(Continued)

OTHER PUBLICATIONS

Search Report and Written Opinion dated Oct. 6, 2020 in counterpart International Patent Application No. PCT/KR2020/007588.

(Continued)

*Primary Examiner* — Roshn K Varghese
(74) *Attorney, Agent, or Firm* — Nixon & Vanderhye P.C.

(57) ABSTRACT

According to an embodiment of the disclosure, an electronic device includes: a transparent front surface plate defining at least a portion of a front surface of the electronic device, and including a first edge and a second edge disposed on opposite sides, a third edge connecting one end of the first edge and one end of the second edge, and a fourth edge connecting another end of the first edge and another end of the second edge and disposed opposite the third edge; a rear surface plate defining at least a portion of a rear surface of the electronic device; a side housing surrounding at least a portion of a space between the front surface plate and the rear surface plate; a support disposed in the space and connected with the side housing or integrally formed with the side housing; a display disposed in the space and viewable through at least a portion of the front surface plate; a second flexible printed circuit board (FPCB) disposed to at least partially overlap the display when viewed above the (Continued)

front surface plate; a first FPCB connecting the display and the second FPCB, and disposed in a folded state within a specified proximity of the fourth edge and having a portion overlapping the display when viewed above the front surface plate; a first seal disposed between the first FPCB and the support, or between the second FPCB and the support, and extending from a first end to a second end along the fourth edge; a second seal disposed between the display and the support, and extending from a third end proximate the first end to a fourth end proximate the second end along the first edge, the third edge, and the second edge; and a third seal disposed between the first end of the first seal and the third end of the second seal, and between the second end of the first seal and the fourth end of the second seal, and connecting the first seal and the second seal.

19 Claims, 30 Drawing Sheets

(51) Int. Cl.
    *H05K 5/00*     (2006.01)
    *H01R 12/61*     (2011.01)

(58) Field of Classification Search
    CPC ...... H04M 1/026; H04M 1/18; H04M 1/0202; H04M 1/0277; H04M 2250/12; H05K 5/0017; H05K 5/0217; H05K 5/03; H05K 5/069; H05K 5/061; H05K 5/0086; H05K 5/062; H05K 1/189; H05K 2201/10128; C09J 9/00; H01R 12/61

See application file for complete search history.

(56) References Cited

U.S. PATENT DOCUMENTS

| | | | |
|---|---|---|---|
| 2012/0081875 A1 | 4/2012 | Yamaguchi et al. | |
| 2014/0090769 A1* | 4/2014 | Ely | F16J 15/14 |
| | | | 264/261 |
| 2015/0253613 A1 | 9/2015 | Yoon et al. | |
| 2017/0099742 A1* | 4/2017 | Choi | G06F 1/1656 |
| 2018/0033571 A1* | 2/2018 | Choi | H04M 1/0266 |
| 2018/0160545 A1 | 6/2018 | Kim et al. | |
| 2018/0310426 A1* | 10/2018 | Cho | H05K 5/069 |
| 2019/0037694 A1 | 1/2019 | Koo et al. | |

FOREIGN PATENT DOCUMENTS

| | | |
|---|---|---|
| EP | 330 832 A1 | 6/2018 |
| KR | 10-2014-0062852 | 5/2014 |

OTHER PUBLICATIONS

Extended European Search Report dated May 17, 2022 for EP Application No. 20831896.4.
India Office Action dated Jun. 2, 2022 for IN Application No. 202117054445.

* cited by examiner

ELECTRONIC DEVICE INCLUDING DISPLAY

CROSS-REFERENCE TO RELATED APPLICATION

This application is based on and claims priority under 35 U.S.C. § 119 to Korean Patent Application No. 10-2019-0076492, filed on Jun. 26, 2019, in the Korean Intellectual Property Office, the disclosure of which is incorporated by reference herein in its entirety.

BACKGROUND

Field

The disclosure relates to an electronic device including a display.

Description of Related Art

Electronic devices such as smartphones have become slimmer while highlighting design aspects. Electronic devices are developing to have distinct functions to meet consumers' purchasing demands. For example, electronic devices may have a waterproof function.

An electronic device may include a window and a display disposed along a rear surface of the window and exposed or viewable through the window. The electronic device may include a sealing structure which has a sealing member disposed along a border area of the rear surface of the window.

However, considering that consumers prefer an electronic device having a large size screen, the sealing structure may make it difficult to extend the size of the display due to an area occupied by the sealing member.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide an electronic device including a sealing structure for implementing a waterproof function while making it easy to extend a size of a display.

According to an example embodiment of the disclosure, an electronic device may include: a transparent front surface plate defining at least a portion of a front surface of the electronic device, the front surface plate including a first edge and a second edge disposed on opposite sides, a third edge connecting one end of the first edge and one end of the second edge, and a fourth edge connecting another end of the first edge and another end of the second edge, the fourth edge being disposed opposite the third edge; a rear surface plate (e.g., rear cover) defining at least a portion of a rear surface of the electronic device; a side surface surrounding at least a portion of a space between the front surface plate and the rear surface plate; a support disposed in the space and connected with the side surface or integrally formed with the side surface; a display disposed in the space and viewable through at least a portion of the front surface plate; a second flexible printed circuit board (FPCB) disposed to at least partially overlap the display when viewed above the front surface plate; a first FPCB connecting the display and the second FPCB disposed in a folded state in a specified proximity of the fourth edge and having a portion overlapping the display when viewed above the front surface plate; a first seal disposed between the first FPCB and the support, or between the second FPCB and the support, and extending from a first end to a second end along the fourth edge; a second seal disposed between the display and the support, and extending from a third end within a specified distance to the first end to a fourth end within a specified distance to the second end along the first edge, the third edge, and the second edge; and a third seal disposed between the first end of the first seal and the third end of the second seal, and between the second end of the first seal and the fourth end of the second seal, and connecting the first seal and the second seal.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Hereinafter, various example embodiments of the disclosure will be described in greater detail with reference to the accompanying drawings.

Figure 1:
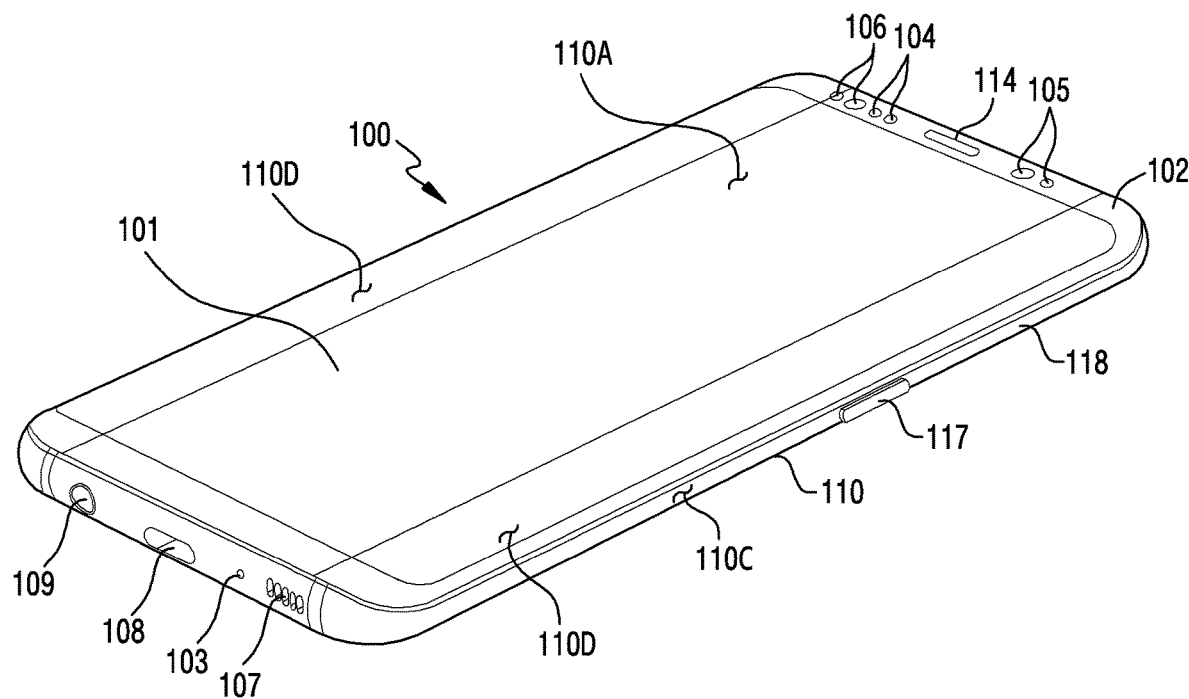
FIG. 1 is a front perspective view illustrating an example mobile electronic device according to an embodiment.
Figure 2:
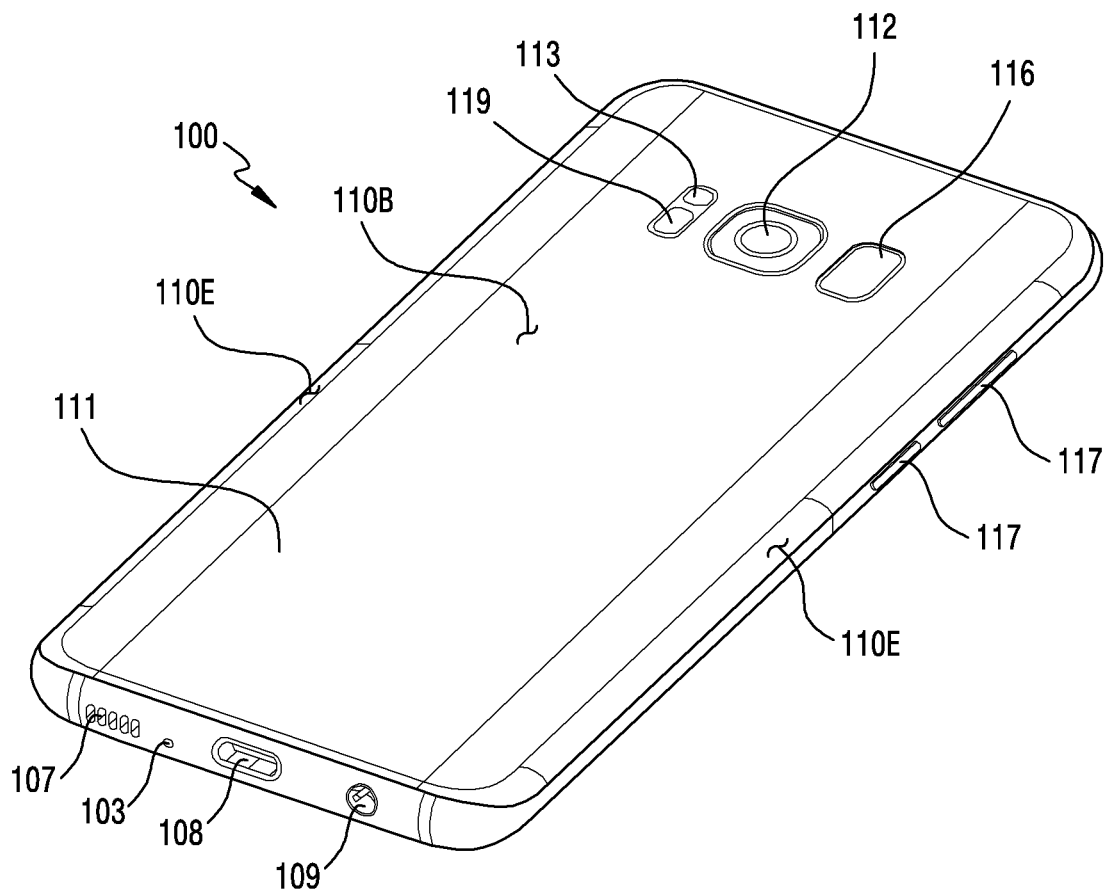
FIG. 2 is a rear perspective view illustrating the electronic device of FIG. 1 according to an embodiment.

FIG. 1 is a front perspective view illustrating an example mobile electronic device according to an embodiment, and FIG. 2 is a rear perspective view illustrating the electronic device of FIG. 1 according to an embodiment.

Referring to FIG. 1 and FIG. 2, an electronic device 100 according to an embodiment may include a housing 110 including a first side (or a front side) 110A, a second side (or a rear side) 110B, and a lateral side (surface) 110C surrounding a space between the first side 100A and the second side 110B. In an embodiment (not shown), the housing may refer to a structure which includes part of the first side 110A, second side 110B, and third side 110C of FIG. 1. According to an embodiment, the first side 110A may be constructed of a front plate 102 (or a front cover) (e.g., a polymer plate or a glass plate having various coating layers) which is at least partially transparent.

The second side 110B may include a rear plate 111 (or a rear cover) which may be opaque. For example, the rear plate 111 may be constructed, for example, and without limitation, of coated or colored glass, ceramic, polymer, metallic materials (e.g. aluminum, stainless steel (STS), or magnesium), a combination of at least two of these materials, or the like.

The lateral side 110C (or a side member or side surface) may be constructed of a lateral bezel structure (or a lateral member) 118 bonded to the front plate 102 and the rear plate 111 and including, for example, and without limitation, metal and/or polymer. In some embodiments, the rear plate 111 and the lateral bezel structure 118 may be constructed integrally and may include the same material (e.g., a metallic material such as aluminum).

In the illustrated embodiment, the front plate 102 may include a first region 110D that bends from the first side 110A toward the rear plate and extends seamlessly, at both end of a long edge of the front plate. In the illustrated embodiment (referring FIG. 2), the rear plate 111 may include a second region 110E that extends from the second side 110B toward the front plate and extends seamlessly, at both ends of the long edge. In various example embodiments, the front plate or the rear plate may comprise only one of the first region or the second region. In various example embodiments, the front plate 102 does not include a first region 110D and a second region, and may include only a flat plane disposed in parallel with the second side 110B. In the above embodiments, as viewed from the side of the electronic device, the lateral bezel structure has a first thickness (or width) on the side where the first region or the second region is not included, and a second thickness that is thinner than the first thickness on the side including the first region or the second region.

According to an embodiment, the electronic device 100 may include, for example, and without limitation, at least one or more of a display 101, an input device 103, audio output devices 107, and 114, sensor modules 104, 119, camera modules 105, 112, and 113, and key input devices 116 and 117, an indicator 106, and connector holes 108 and 109. In various example embodiments, the electronic device 100 may omit at least one (e.g., the key input devices 116 and 117 or the indicator 106) of these components or may additionally include other components.

The display 101 may be viewable through, for example, some portions of the front plate 102. In an example embodiment, A portion of the display 101 may be exposed through the front plate 102 forming the first side 110A and the first region 110D of the lateral side 110C. The display 101 may be disposed adjacent to or bonded to, for example, and without limitation, a touch sensing circuit, a pressure sensor capable of measuring touch strength (pressure), and/or a digitizer for detecting a stylus pen of a magnetic field type. In an example embodiment, at least portion of the sensor modules 104, 119 and/or at least portion of the key input devices are disposed on the first portion 110D and/or the second portion 110E.

The audio modules 103, 107, and 114 may include a microphone hole 103 and speaker holes 107 and 114. A microphone for acquiring external sound may be disposed inside the microphone hole 103. In some embodiments, a plurality of microphones may be disposed to sense a direction of the sound. The speaker holes 107 and 114 may include the external speaker hole 107 and the receiver hole 114 for a call. In some embodiments, the speaker holes 107 and 114 and the microphone hole 103 may be implemented as a single hole, or a speaker (e.g., a piezo speaker) may be included without the speaker holes 107 and 114.

The sensor modules 104, 116 and 119 may generate an electrical signal or data value corresponding to an internal operating state of the electronic device 100 or an external environmental state. The sensor modules 104, 116 and 119 may include, for example, the first sensor module 104 (e.g., a proximity sensor) and/or second sensor module (not shown) (e.g., a fingerprint sensor) disposed to the first side 110A of the housing 110, and/or the third sensor module 119 (e.g., an HRM sensor) disposed to the second side 110B of the housing 110. The fingerprint sensor may be disposed to a portion of the first side 110A (e.g., a home key button 115) or the second side 110B of the housing or below the display 101. The electronic device 100 may further include at least one of a sensor module (not shown), for example, and without limitation, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, an illumination sensor 104, or the like.

The camera modules 105, 112, and 113 may include the first camera device 105 disposed to the first side 110A of the electronic device 100, the second camera device 112 disposed to the second side 110B, and/or the flash 113. The camera modules 105 and 112 may include one or more lenses, an image sensor, and/or an image signal processor. The flash 113 may include, for example, and without limitation, a Light Emitting Diode (LED), a xenon lamp, or the like. In some embodiments, two or more lenses (wide angle and telephoto lenses) and image sensors may be disposed to one side of the electronic device 100.

The key input devices 117 may be disposed to the first side 110A of the housing 110. In an embodiment, the electronic device 100 may not include some or all of the aforementioned key input devices 117. The key input devices 116, and 117, which are not included, may be implemented using a soft key displayed on the display 101 or a in a pressure sensor included in the display 101. In some embodiments, the key input device 117 may include a sensor module 116 disposed on the second side 110B of the housing 110.

The indicator 106 may be disposed to, for example, the first side 110A of the housing 110. The indicator 106 may provide, for example, state information of the electronic device 100 in an optical form and may include an LED (light emitting diode), IR LED and Xenon lamp.

The connector holes 108 and 109 may include the first connector hole 108 capable of accommodating a connector (e.g., a USB connector) for transmitting/receiving power and/or data of an external electronic device and/or the second connector hole or earphone jack 109 capable of accommodating a connector for transmitting/receiving an audio signal with respect to the external electronic device.

Figure 3:
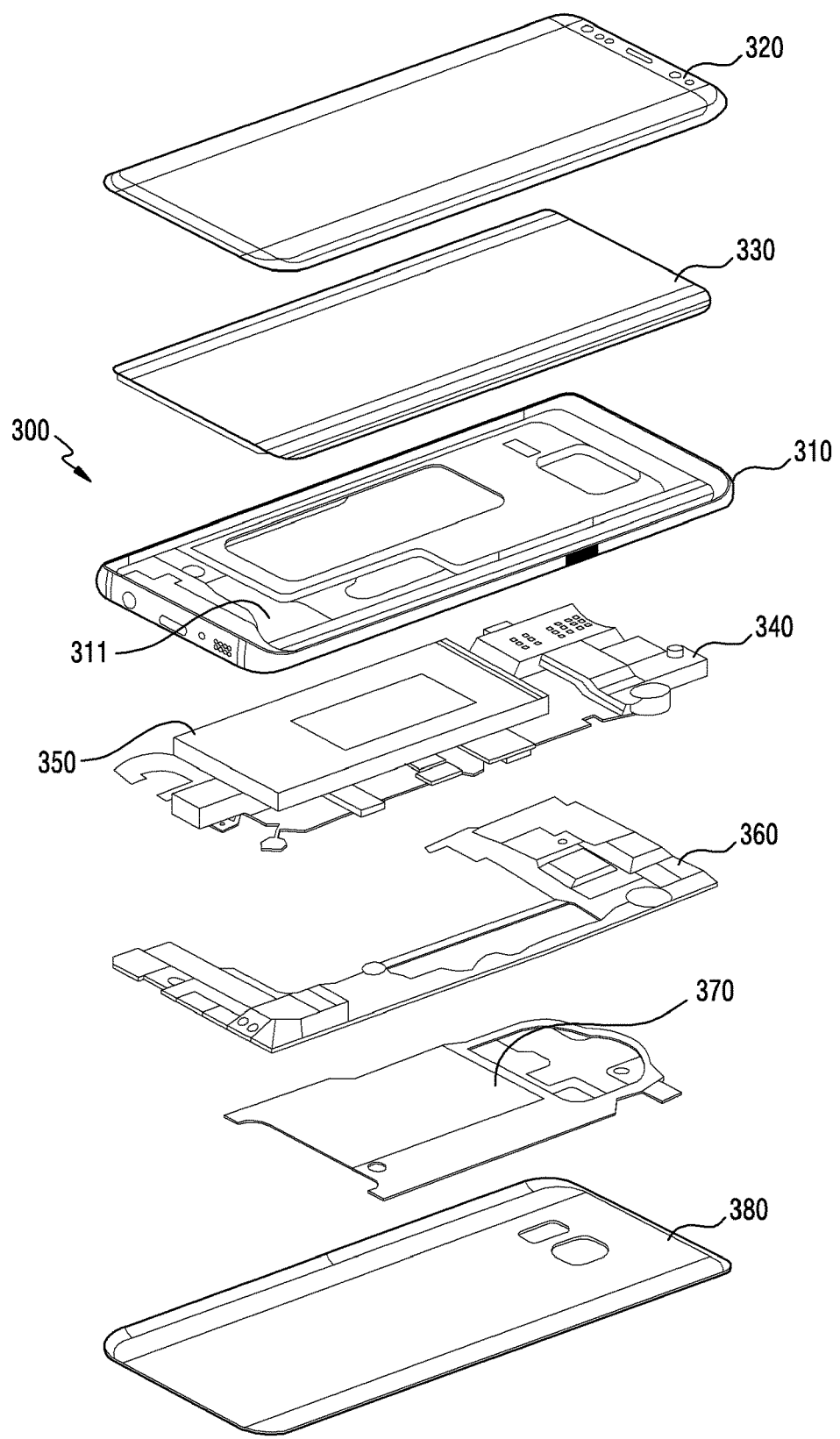
FIG. 3 is an exploded perspective view illustrating the electronic device of FIG. 1 according to an embodiment.

FIG. 3 is an exploded perspective view illustrating the electronic device of FIG. 1 according to an embodiment;

Referring to FIG. 3, an electronic device 300 (e.g., the electronic device (100) of FIG. 1 or FIG. 2) may include a lateral bezel structure 310, a first support member 311 (e.g., a bracket), a front plate 320, a display 330, a printed circuit board 340, a battery 350, a second support member 360 (e.g., a rear case), an antenna 370, and a rear plate 380. In some embodiments, the electronic device 300 may omit at least one (e.g., the first support member 311) of these components, or may additionally include other components. At least one of the components of the electronic device 300 may be the same as or similar to at least one of the components of the electronic device 100 of FIG. 1 or FIG. 2, and redundant descriptions will not be repeated here.

The first support member 311 may be coupled with the lateral bezel structure 310 by being disposed inside the electronic device 300 or may be constructed integrally with respect to the lateral bezel structure 310. The first support member 311 may be constructed of, for example, and without limitation, a metal material and/or non-metal material (e.g., polymer), or the like. The display 330 may be bonded to one side of the first support member 311, and the printed circuit board 340 may be bonded to the other side thereof. A processor, a memory, and/or an interface may be mounted on the printed circuit board 340. The processor may include various processing circuitry, such as, for example, and without limitation, one or a central processing unit, an application processor, a graphic processing unit, an image signal processor, a sensor hub processor, a communication processor, or the like.

The memory may include, for example, a volatile memory or a non-volatile memory.

The interface may include, for example, and without limitation, a High Definition Multimedia Interface (HDMI), a Universal Serial Bus (USB) interface, a Secure Digital (SD) card interface, an audio interface, or the like. For example, the interface may electrically or physically couple the electronic device 300 and the external electronic device, and may include a USB connector, an SD card/MMC connector, or an audio connector.

As a device for supplying power to at least one component of the electronic device 300, the battery 350 may include, for example, and without limitation, a non-rechargeable primary cell, a rechargeable secondary cell, a fuel cell, or the like. At least one portion of the battery 350 may be disposed on the same plane substantially with respect to, for example, the printed circuit board 340. The battery 350 may be disposed integrally inside the electronic device 100, or may be detachably disposed with respect to the electronic device 300.

The antenna 370 may be disposed between the rear plate 380 and the battery 350. The antenna 370 may include, for example, and without limitation, a Near Field Communication (NFC) antenna, a wireless charging antenna, a Magnetic Secure Transmission (MST) antenna, or the like. The antenna 370 may perform short-range communication, for example, with the external electronic device, or may wirelessly transmit/receive the power required for charging. In an embodiment, an antenna structure may be constructed by at least part of the lateral bezel structure 310 and/or the first support member 311 or a combination thereof.

Figure 4A:
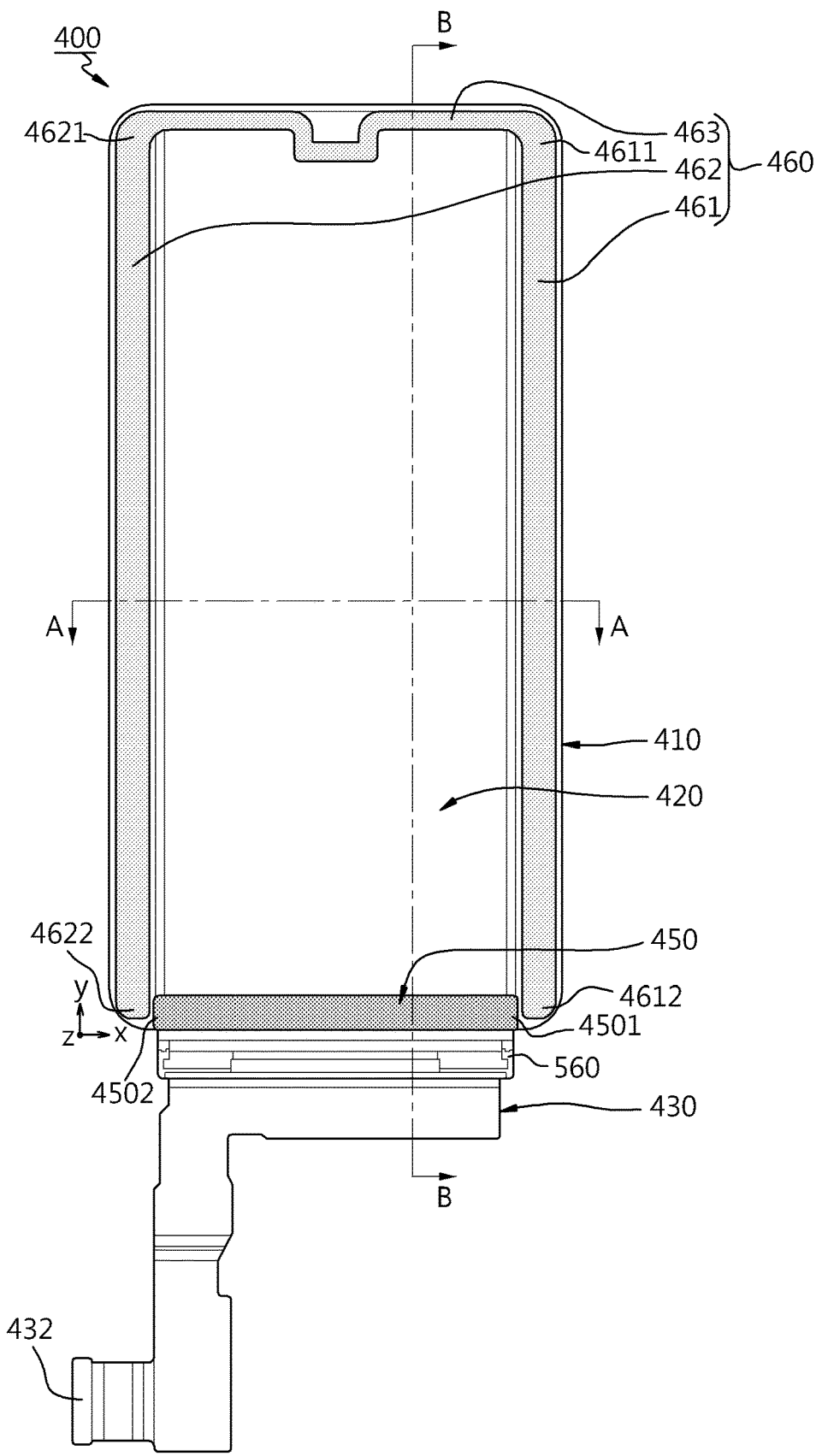
FIG. 4A is a diagram illustrating an example display module according to an embodiment.
Figure 4B:
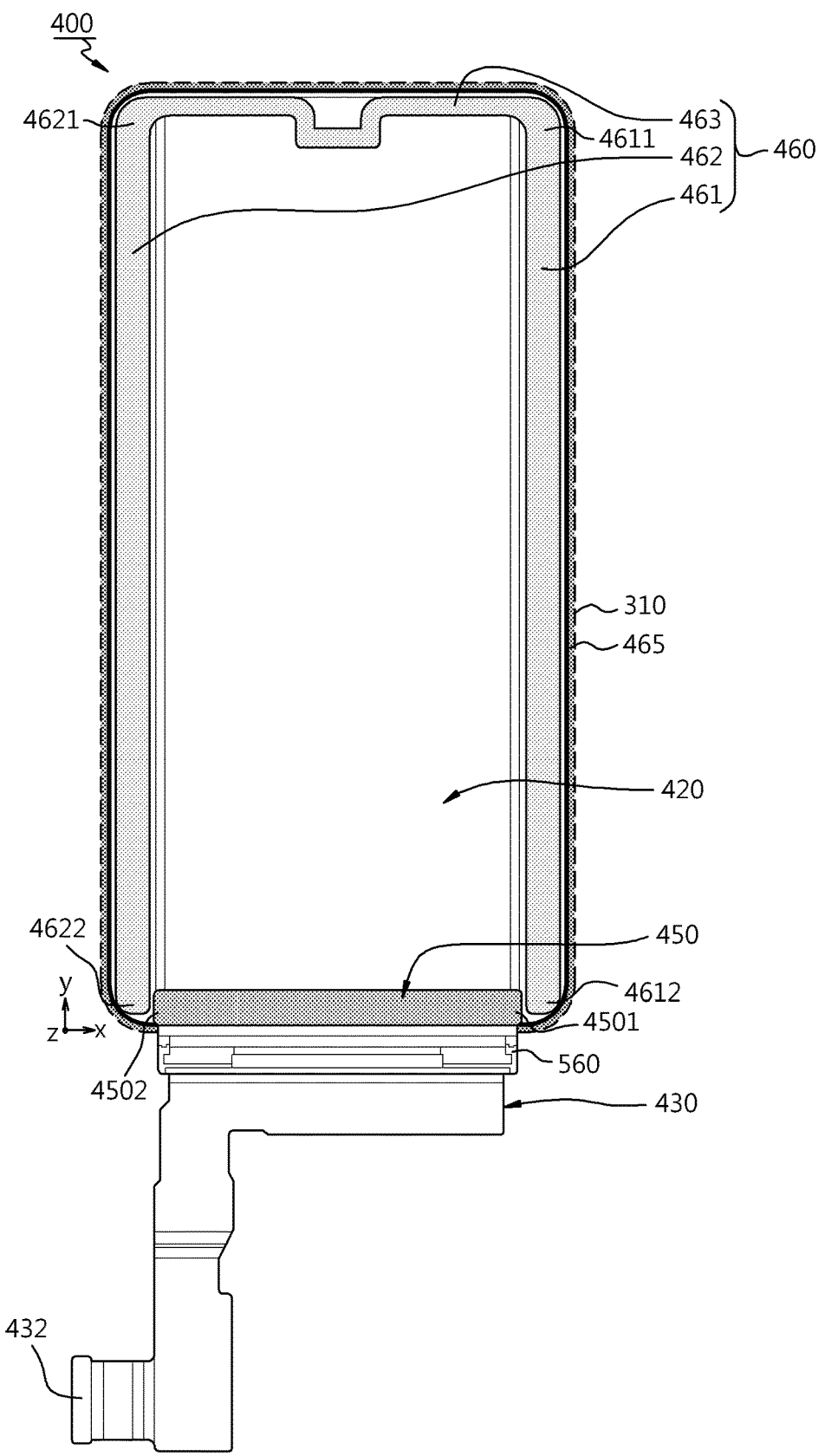
FIG. 4B is a diagram illustrating an example display module according to an embodiment.
Figure 5A:
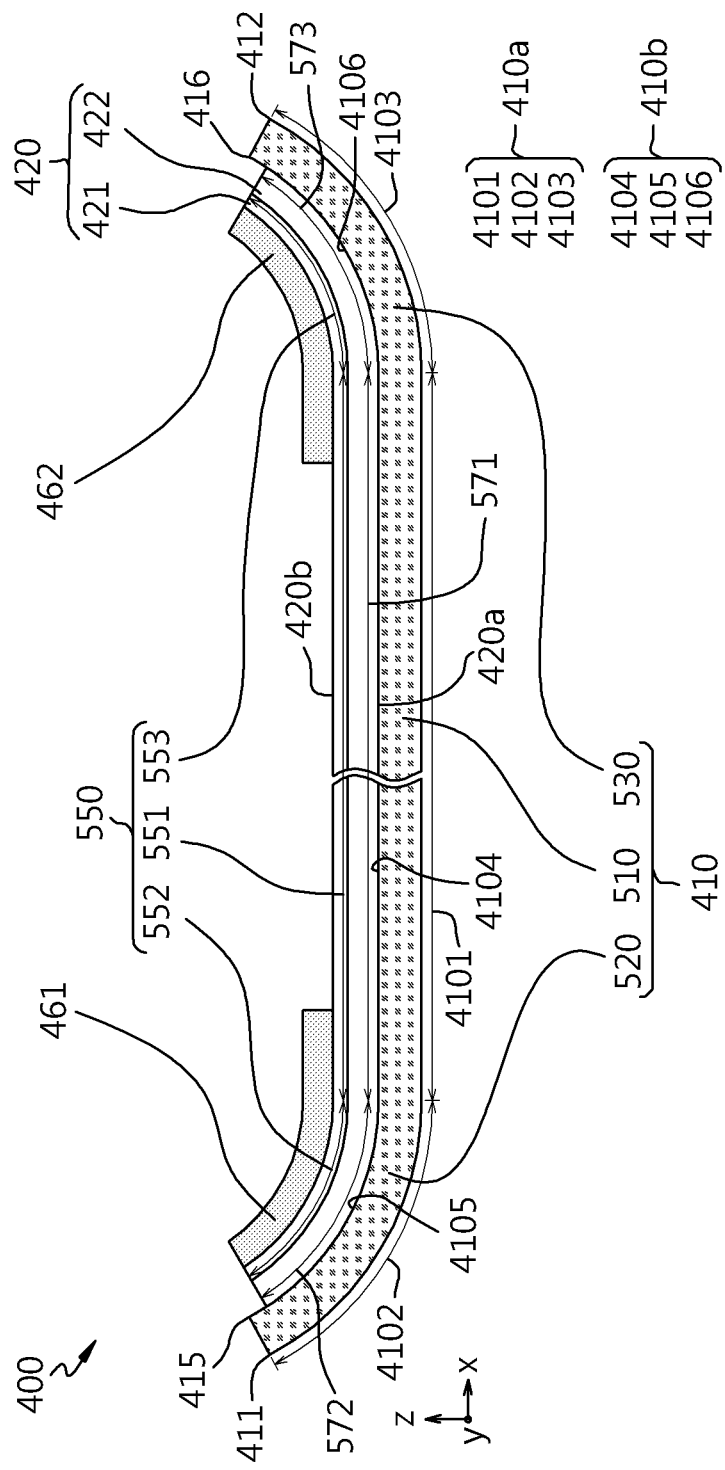
FIG. 5A is a cross-sectional view of an A-A portion in the display module of FIG. 4A according to an embodiment.
Figure 5B:
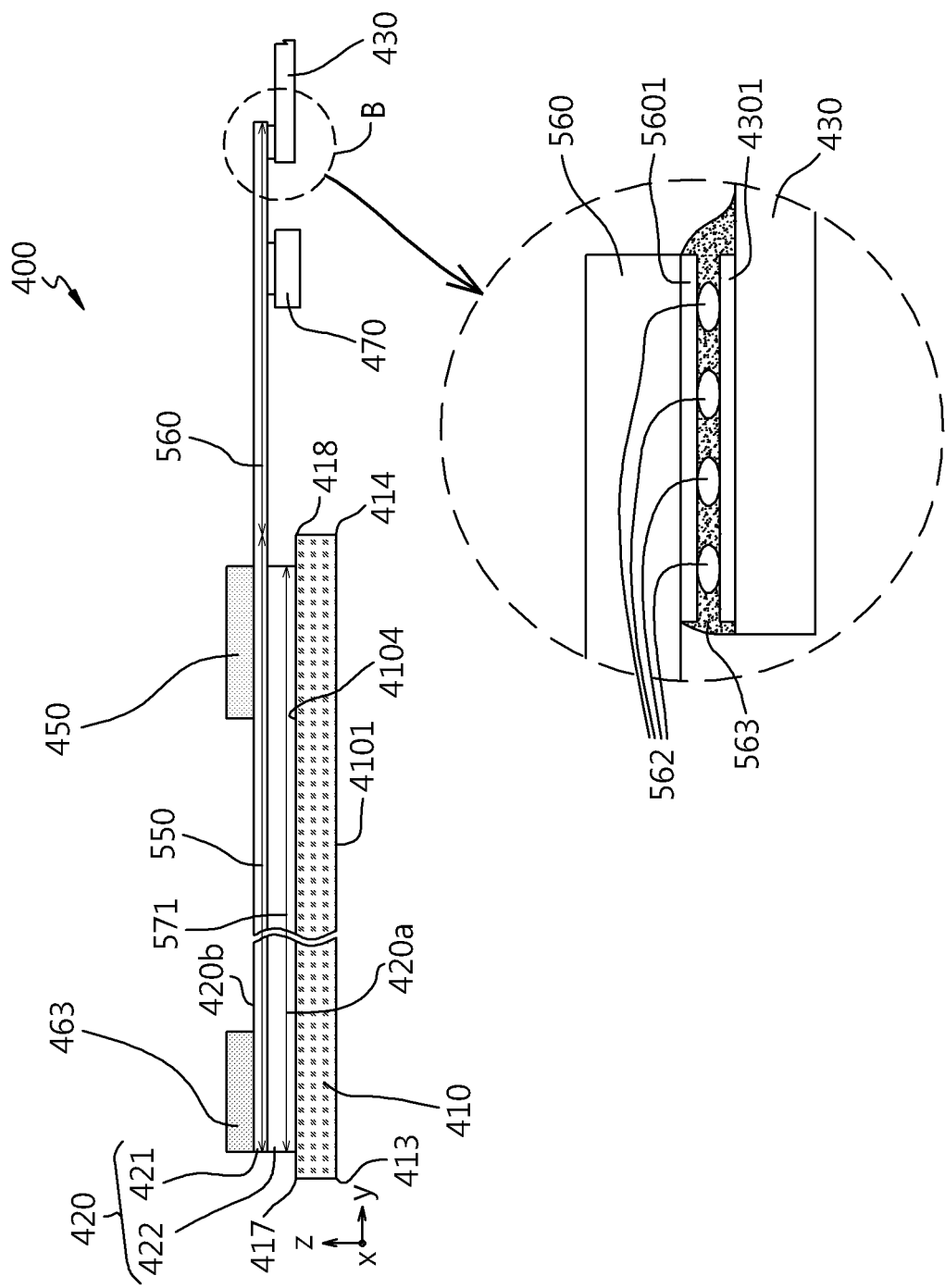
FIG. 5B is a cross-sectional view of a B-B portion in the display module of FIG. 4A according to an embodiment.
Figure 5C:
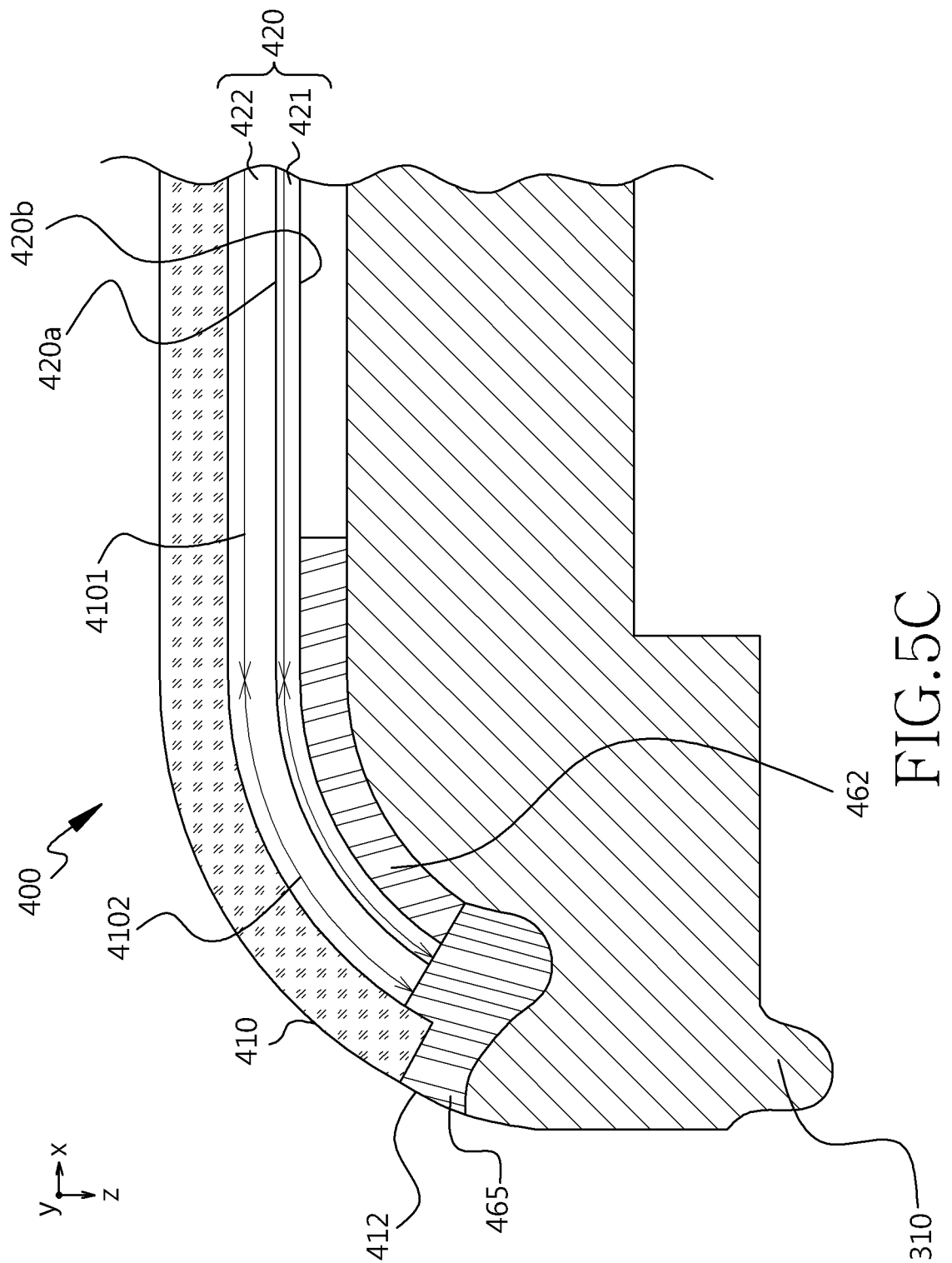
FIG. 5C is a cross-sectional view of a portion of the display module of FIG. 4B according to an embodiment.
Figure 6:
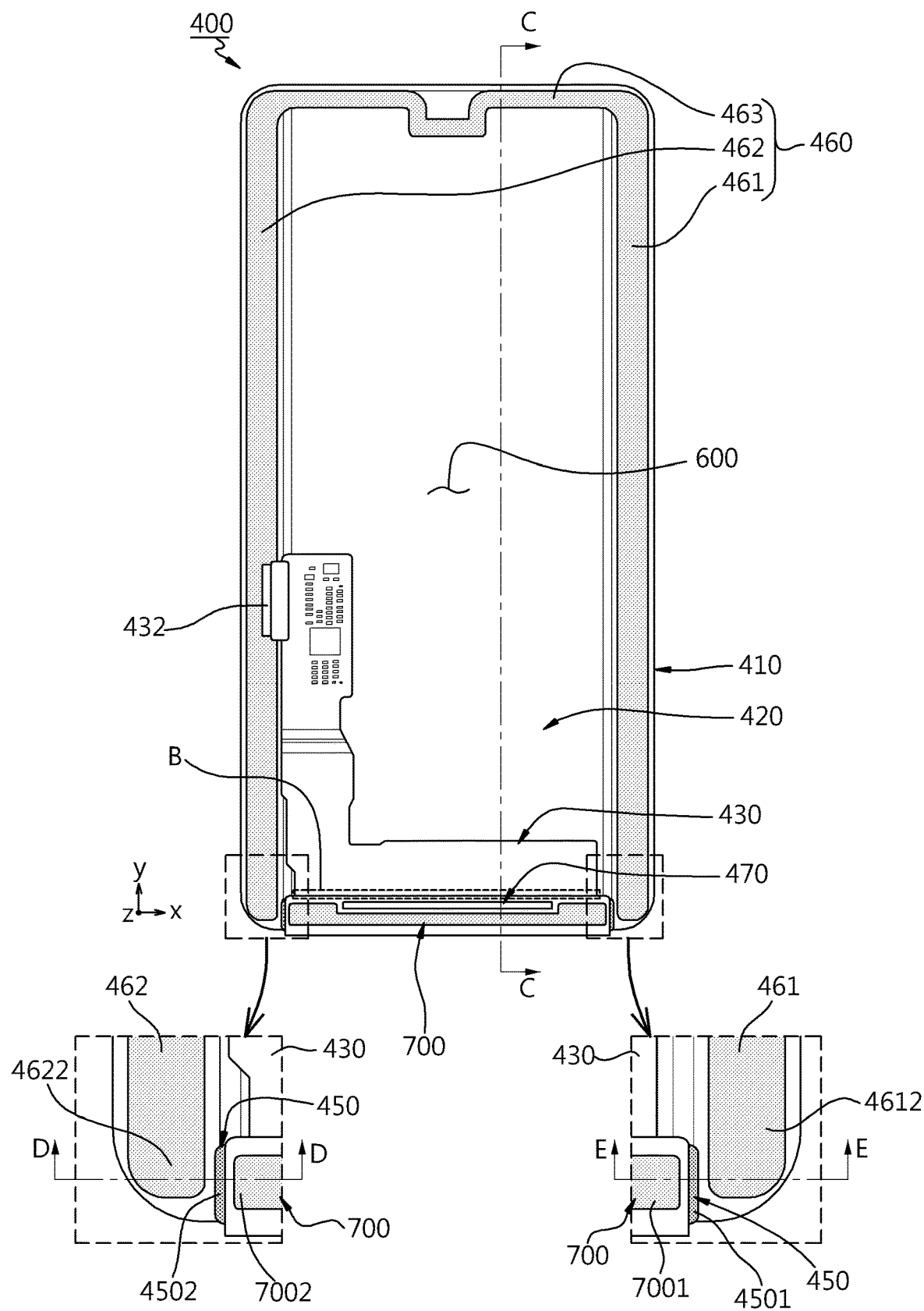
FIG. 6 is a diagram illustrating a second substrate area which is bent and is disposed in the display module of FIGS. 4A and 4B according to an embodiment.
Figure 7:
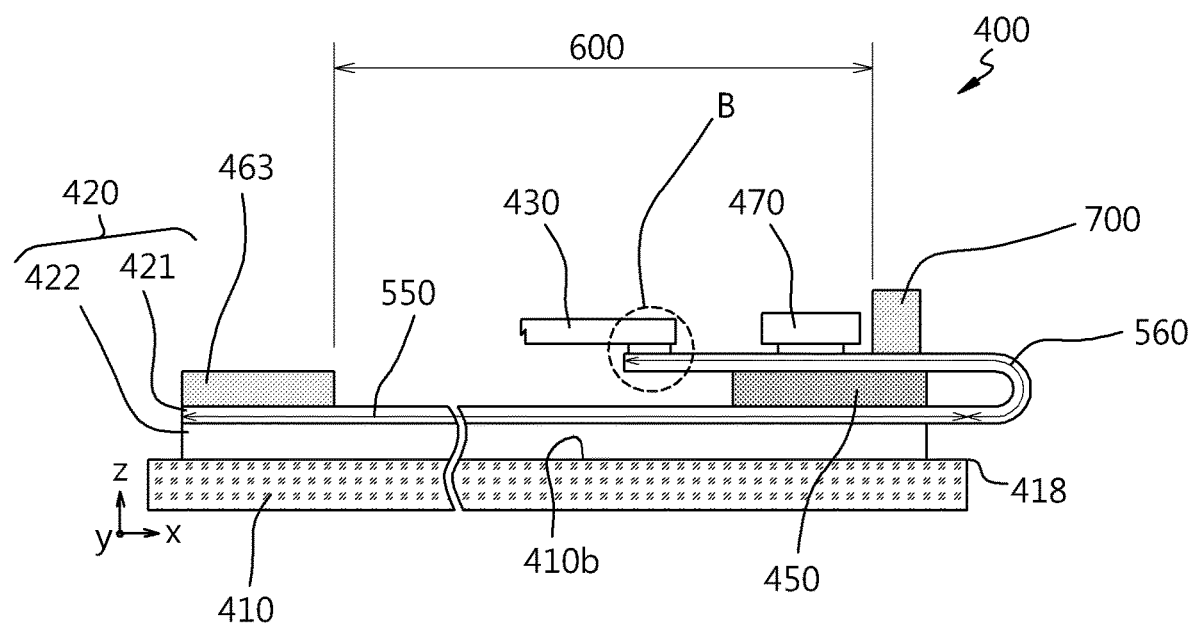
FIG. 7 is a cross-sectional view of a C-C portion in the display module of FIG. 6 according to an embodiment.
Figure 8:
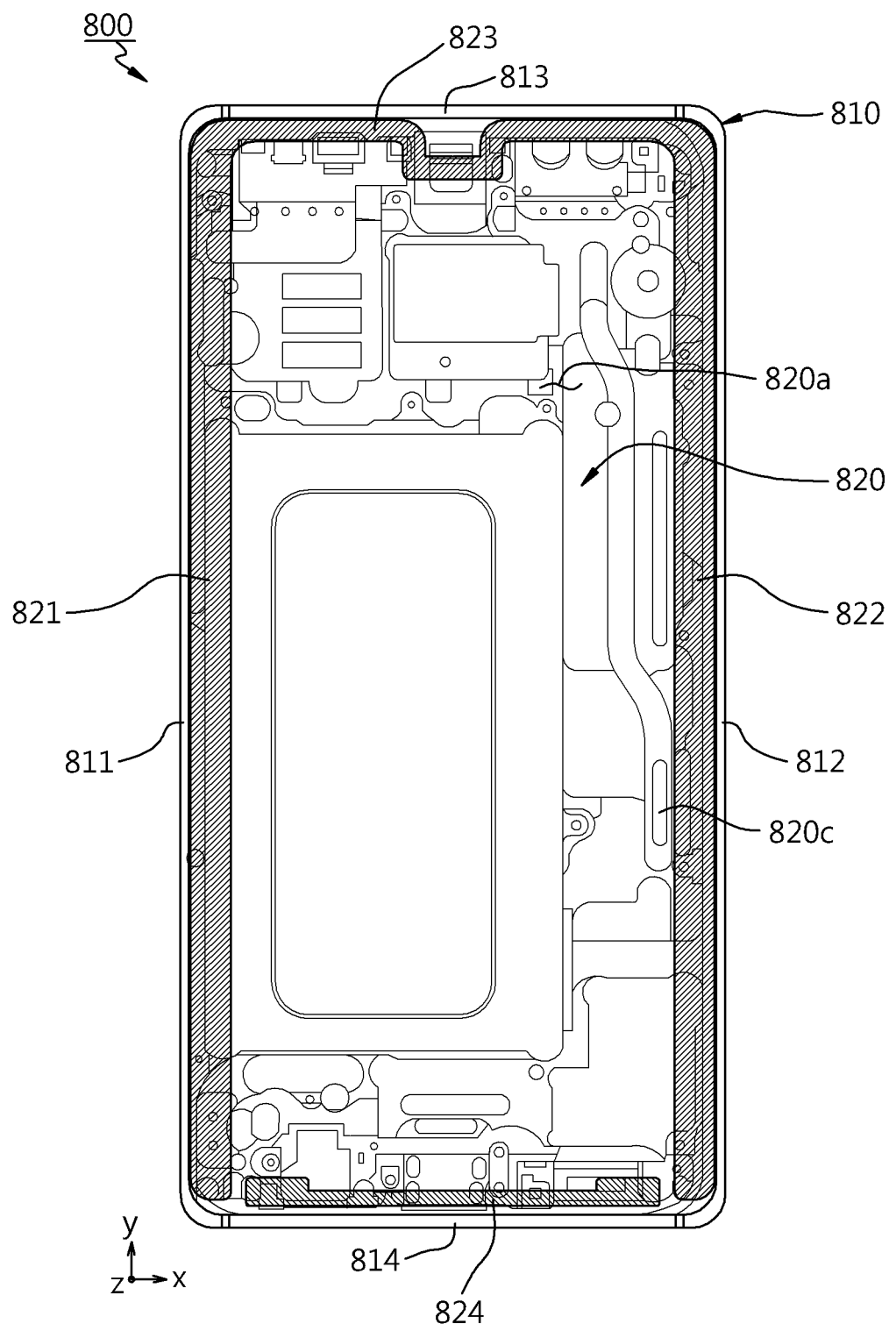
FIG. 8 is a diagram illustrating an example support structure to which the display module of FIG. 6 is coupled according to an embodiment.

FIG. 4A is a diagram illustrating an example display module according to an embodiment, and FIG. 4B is a diagram illustrating an example display module according to an embodiment. FIG. 5A is a cross-sectional view of an A-A portion in the display module of FIGS. 4A and 4B according to an embodiment. FIG. 5B is a cross-sectional view of a B-B portion in the display module of FIGS. 4A and 4B according to an embodiment. FIG. 5C is a cross-sectional view of a portion in the display module of FIG. 4B according to an embodiment. FIG. 6 is a diagram illustrating a second substrate area which is bent and is disposed in the display module of FIGS. 4A and 4B according to an embodiment. FIG. 7 is a cross-sectional view of a C-C portion in the display module of FIG. 6 according to an embodiment. FIG. 8 is a diagram illustrating an example support structure to which the display module of FIG. 6 is coupled according to an embodiment.

Referring to FIGS. 4A, 5A and 5B, the display module 400 may include a window (e.g., a transparent cover) 410, a display 420, a flexible printed circuit board (FPCB) 430, a fourth sealing member (e.g., adhesive member) 450, and/or a display operating driver 470.

According to an embodiment, the window 410 (for example, the front surface plate 102 of FIG. 1 or 2, or the front surface plate 320 of FIG. 3) may include a front surface 410a and a rear surface 410b.

The front surface 410a may include, for example, a first edge 411, a second edge 412, a third edge 413, and a fourth edge 414. The first edge 411 and the second edge 412 may be disposed on the opposite sides and may be parallel to each other. The third edge 413 and the fourth edge 414 may be disposed on the opposite sides and may be parallel to each other. The third edge 413 may connect one end of the first edge 411 and one end of the second edge 412. The fourth edge 414 may connect the other end of the first edge 411 and the other end of the second edge 412.

According to an embodiment, the first edge 411 and the second edge 412 may have a linear form having a first length, and the third edge 413 and the fourth edge 414 may have a linear form having a second length less than the first length. According to an embodiment, a portion where the first edge 411 and the third edge 413 meet each other, a portion where the first edge 411 and the fourth edge 414 meet each other, a portion where the second edge 412 and the third edge 413 meet each other, and/or a portion where the second edge 412 and the fourth edge 414 meet each other may have a curved shape.

According to an embodiment, the front surface 410a may include a first planar surface 4101, and a first curved surface 4102 extended from one edge (not shown) of the first planar surface 4101. The front surface 410a may include a second curved surface 4103 extended from the other edge disposed opposite the one edge. The first curved surface 4102 may be extended from the first edge 411 and may be connected with the first planar surface 4101, and the second curved surface 4103 may be extended from the second edge 412 and may be connected with the first planar surface 4101.

The rear surface 410b may be disposed opposite the front surface 410a and may have a similar form to that of the front surface 410a, and may include, for example, a second planar surface 4104 following the first planar surface 4101, a third curved surface 4105 following the first curved surface 4102, and a fourth curved surface 4106 following the second curved surface 4103. The rear surface 410b may include a fifth edge 415 disposed along the first edge 411, a sixth edge 416 disposed along the second edge 412, a seventh edge 417 disposed along the third edge 413, and an eighth edge 418 disposed along the fourth edge 414.

According to an embodiment, the window 410 may include a first portion 510 which is planar and forms the first planar surface 4101 and the second planar surface 4104, a second portion 520 which is curvedly extended from the first portion 510 and forms the first curved surface 4102 and the third curved surface 4105, and a third portion 530 which is curvedly extended from the first portion 510 and forms the second curved surface 4103 and the fourth curved surface 4106.

According to various embodiments (not shown), the second portion 520 and/or the third portion 530 may be implemented to be substantially planar and to form a planar front surface and a planar rear surface with the first portion 510.

According to an embodiment, the display 420 (for example, the display 101 of FIG. 1 or the display 330 of FIG. 3) may be disposed along at least a portion of the rear surface 410b of the window 410. For example, the display 420 may be coupled to the rear surface 410b of the window 410 using, for example, a transparent optical material (for example, optically clear adhesive (OCA), optically clear resin (OCR), etc.).

According to an embodiment, the display 420 may include a substrate 421 and a display panel 422. When viewed above the front surface 410a of the window 410, the substrate 421 may include a first substrate area 550 overlapping the window 410, and a second substrate area 560 extended from the first substrate area 550. When viewed above the front surface 410a of the window 410, the first substrate area 550 may include a planar substrate area 551 which overlaps the first portion 510 of the window 410, a first bent substrate area 552 which overlaps the second portion 510 of the window 410, and a second bent substrate area 553 which overlaps the third portion 520 of the window 410. The display panel 422 may be formed between the first substrate area 550 and the window 410 along the first substrate area 550 at least in part. According to an embodiment, the display panel 422 may include a planar panel area 571 exposed through the first portion 510 of the window 410, a first bent panel area 572 exposed through the second portion 520 of the window 410, and a second bent panel area 573 exposed through the third portion 530 of the window 410.

According to an embodiment, the display panel 422 may be referred to as a component including the first substrate area 550 of the substrate 421.

According to various embodiments (not shown), the first bent panel area 572 may be extended to the fifth edge 415 of the window 410, and the first bent substrate area 552 may be extended to correspond thereto. According to various embodiments (not shown), the second bent substrate area 553 may be extended to the sixth edge 416 of the window 410, and the second bent panel area 573 may be extended to correspond thereto.

The substrate 421 (for example, a panel substrate, a back plane, or a back plane substrate) may be a substrate (for example, a polyimide substrate) that is formed with plastic having flexibility. The display panel 422 may include, for example, at least one thin film transistor (TFT) (not shown), and a light emitting layer (not shown) forming a plurality of pixels which are controlled by the TFT. The TFT may be disposed between the light emitting layer and the substrate 421, and the TFT, the light emitting layers, and wires related thereto may be formed on the substrate 421 through a series of processes such as deposition, patterning, etching, or the like. According to an embodiment, the light emitting layer of the display panel 422 may include an organic light emitting diode (OLED), and may include an anode, a cathode, and an organic material layer formed on the TFT through evaporation. The anode may be an electrode that emits holes, the cathode may be an electrode that emits electrons, and the organic material layer may be disposed between the anode and the cathode. Due to a reaction of an active layer of the TFT, a current may flow to a source electrode, an active layer, and a drain electrode, and a voltage may be applied to the anode and the cathode of the light emitting layer electrically connected with the TFT. Accordingly, electrons emitted from the anode and holes emitted from the cathode may be coupled in the organic material layer, and excitation energy caused by the coupling of the electrons and the holes may be emitted from the organic material layer in the form of light. According to various embodiments, the light emitting layer may be substituted with a light emitting element of a structure different from the OLED.

According to an embodiment, the TFT may be a TFT based on low-temperature polycrystalline silicon (LTPS). According to various embodiments, the TFT may be a TFT based on amorphous silicon (a-Si).

According to an embodiment, the display panel 422 may include an encapsulation to prevent and/or reduce the light emitting layer from being externally influenced. Since the organic material layer, the anode, or the cathode included in the light emitting layer may react to oxygen or moisture and may lose their light emitting characteristic, the encapsulation may serve as a seal or a sealant to prevent and/or reduce the light emitting layer from being exposed, and may prevent and/or reduce oxygen or moisture from permeating the light emitting layer. According to an embodiment, the encapsulation may include a thin film encapsulation (TFE).

According to various embodiments, the display panel 422 may further include an optical layer disposed on the encapsulation. The optical layer may include a phase retardation layer (e.g., retarder), and a polarizing layer (e.g., a polarizer) disposed on the phase retardation layer. According to various embodiments, the display panel 422 may further include various layers which are not illustrated. For example, the display panel 422 may include a buffer layer which is disposed between the TFT and the substrate 421 and is formed with a material such as silicon oxide, silicon nitride, etc. For example, the display panel 422 may include a protection layer which is disposed between the buffer layer and the substrate 421, and is formed with various materials such as polymer.

According to various embodiments, the display panel 422 may be various displays based on a TFT, and may include, for example, an active matrix organic light emitting diode (AMOLED) display, a passive matrix organic light emitting diode (PMOLED) display, or a liquid crystal display (LCD).

According to various embodiments, the display panel 422 may be coupled with or disposed adjacent to a touch detection circuit, a pressure sensor for measuring an intensity (pressure) of a touch, and/or a digitizer for detecting a stylus pen of a magnetic field method.

According to an embodiment, the display operating driver 470 (for example, a display driver IC (DDI)) may be disposed on the second substrate area 560 of the substrate 421. An electric path (not shown) may be disposed in the substrate 421 through evaporation to electrically connect the display operating driver 470 and the display panel 422 (e.g., TFTs). For example, the electric path may be formed in the substrate 421 based on LTPS or a-Si with the TFT. The display operating driver 470 may serve as a signal passage between a processor (for example, an application (AP) processor) included in the electronic device (for example, the electronic device 100 of FIG. 1), and the display panel 422, and may control pixels through the TFT in the display panel 422. For example, the display operating driver 470 may have a function of turning on or off the pixels included in the display panel 422, and may be electrically connected with a gate electrode of the TFT. The display operating driver 470 may have a function of making a color difference by adjusting an amount of red, green, blue (RGB) signal of a pixel, and may be electrically connected with a source electrode of the TFT. The TFT may include a gate line to electrically connect the display operating driver 470 and the gate electrode of the TFT, and a source line (e.g., a data line) to electrically connect the display operating driver 470 and the source electrode of the TFT.

According to an embodiment, the FPCB 430 may be coupled with the second substrate area 560 of the substrate 421. The FPCB 430 may include an electric path for transmitting, to the display operating driver 470, a signal instructed by the processor (for example, the AP) included in the electronic device (for example, the electronic device 100 of FIG. 1) to operate the display panel 422. For example, a connector 432 formed at one end of the FPCB 430 may be electrically connected with a connector disposed in a PCB (for example, the PCB 340 of FIG. 3) in which the processor is disposed. The signal instructed by the processor may be transmitted to the display operating driver 470 disposed on the second substrate area 560 of the substrate 421 through the FPCB 430. The display operating driver 470 may control the TFTs of the display panel 422 disposed on the first substrate area 550, based on the signal from the processor.

According to an embodiment, a coupling portion B between the FPCB 430 and the second substrate area 560 may be formed through anisotropic conductive film (ACF) bonding. For example, the ACF may be an anisotropic conductive film which is formed by mixing minute conductive particles (for example, Ni, carbon, solder ball) with an adhesive resin (for example, a thermosetting resin) and making the mixture in a film state, and causes electricity to pass only in one direction. When the ACF is placed between the FPCB 430 and the second substrate area 560 of the substrate 421 and then are compressed with heat and pressure, a first conductive pattern 5601 formed on the second substrate area 560 of the substrate 421 may be electrically connected with a second conductive pattern 4301 formed on the FPCB 430 through conductive particles 562, and an adhesive resin 563 may couple the second substrate area 560 of the substrate 421 and the FPCB 430.

The method for electrically connecting the display panel 422 and the display operating driver 470, suggested in FIGS. 4A and 5B, may, for example, be chip-on plastic (COP). For example, the COP may be attaching the display operating driver 470 to the second substrate area 560 extended from the first substrate area 550 utilized by the display panel 422. According to various embodiments, the display panel 422 and the display operating driver 470 may be electrically connected with each other in various other methods. For example, a chip-on film (COF) may be utilized as another method for electrically connecting the display panel 422 and the display operating driver 470. The COF may be a structure by which the display operating driver 470 is disposed on a separate flexible film substrate (for example, an FPCB) electrically connecting the first substrate area 550 utilized by the display panel 422, and the FPCB 430, on behalf of the second substrate area 560. In the COF, the flexible film substrate and the first substrate area 550 may be connected to each other by ACF bonding. In the COF structure, the flexible film substrate and the FPCB 430 may be connected to each other by ACF bonding. According to various embodiments, the display operating driver 470 may be disposed on the second substrate area 560 (e.g., the flexible film substrate in the COF) through tape automated bonding (TAB).

According to various embodiments (not shown), the second portion 520 of the window 410 may be implemented to be substantially planar, and in this case, the first bent substrate area 552 and the first bent panel area 572 may be changed to be planar. According to various embodiments (not shown), the third portion 530 of the window 410 may be implemented to be substantially planar, and in this case, the second bent substrate area 553 and the second bent panel area 573 may be changed to planar areas. In the embodiment in which the first bent substrate area 552 and the second bent substrate area 553 are changed to the planar areas, the first substrate area 550 may be formed as a rigid substrate such as a glass substrate.

According to an embodiment, a second sealing member 460 may be disposed on a rear surface 420b of the display 420 (for example, the opposite surface of a front surface 420a of the display 420 coupled with the window 410) along the first edge 411 (e.g., the fifth edge 415), the second edge 412 (e.g., the sixth edge 416), and the third edge 413 (e.g., the seventh edge 417) of the window 410. The second sealing member 460 may be disposed between the display 420 and the side surface bezel member 310 or between the display 420 and the support member 311 to fix, and may fill a space between the display 420 and the side surface bezel member 310. According to an embodiment, the second sealing member 460 may be integrally formed to include a first sealing portion 461 disposed along the first edge 411 (e.g., the fifth edge 415), a second sealing portion 462 disposed along the second edge 412 (e.g., the sixth edge 416), and a third sealing portion 463 disposed along the third edge 413 (e.g., the seventh edge 417). According to an embodiment, the second sealing member 460 may include a sealing member including various adhesive materials (for example, a thermoplastic resin or a thermosetting resin) such as a double-sided tape.

According to an embodiment, the first sealing portion 461 may be disposed along the first bent substrate area 552 of the substrate 421 at least in part adjacent to the fifth edge 415 of the window 410. According to various embodiments, the first sealing portion 461 may be extended to a portion of the planar substrate area 551 from the first bent substrate area 552.

According to an embodiment, the second sealing portion 462 may be disposed along the second bent substrate area 553 of the substrate 421 at least in part adjacent to the sixth edge 416 of the window 410. According to various embodiments, the second sealing portion 462 may be extended to a portion of the planar substrate area 551 from the second bent substrate area 553.

According to an embodiment, the third sealing portion 463 may be disposed adjacent to the seventh edge 417, and may connect one end 4611 of the first sealing portion 461 and one end 4621 of the second sealing portion 462. A portion where the first sealing portion 461 and the third sealing portion 463 are connected to each other may be rounded along a first corner (for example, a portion where the fifth edge 415 and the seventh edge 417 are connected to each other) of the window 410. A portion where the second sealing portion 462 and the third sealing portion 463 are connected with each other may be rounded along a second corner (for example, a portion where the sixth edge 416 and the seventh edge 417 are connected with each other) of the window 410. The other end 4612 of the first sealing portion 461 may be extended to a third corner (for example, a portion where the fifth edge 415 and the eighth edge 418 are connected with each other) of the window 410. The other end 4622 of the second sealing portion 462 may be extended to a fourth corner (for example, a portion where the sixth edge 416 and the eighth edge 418 are connected with each other) of the window 410. According to an embodiment, the fourth sealing member 450 may be disposed on the rear surface 420b of the display 420 between the other end 4612 of the first sealing portion 461 and the other end 4622 of the second sealing portion 462. According to an embodiment, the fourth sealing member 450 may be disposed on the rear surface 420b of the display 420 along the fourth edge 414 (e.g., the eighth edge 418) of the window 410. The fourth sealing member 450 may be disposed adjacent to the eighth edge 418, and may include one end 4501 disposed adjacent to the other end 4612 of the first sealing portion 461 and the other end 4502 disposed adjacent to the other end 4622 of the second sealing portion 462. According to an embodiment, the fourth sealing member 450 may include a coupling member including various adhesive materials (for example, a thermoplastic resin or a thermosetting resin) such as a double-sided tape. For example, a first sealing member 700 (described in greater detail below with reference to FIG. 6) may include a coupling member including various adhesive materials (for example, a thermoplastic resin or a thermosetting resin) such as a double-sided tape. One end 4501 of the fourth sealing member 450 may be disposed to be spaced apart from the other end 4612 of the first sealing portion 461. According to various embodiments (not shown), one end 4501 of the fourth sealing member 450 may be disposed in contact with the other end 4612 of the first sealing portion 461. The other end 4502 of the fourth sealing member 450 may be disposed to be spaced apart from the other end 4622 of the second sealing portion 462. According to various embodiments (not shown), the other end 4502 of the fourth sealing member 450 may be disposed in contact with the other end 4622 of the second sealing portion 462.

Referring to FIGS. 4B and 5C, a fifth sealing member 465 disposed between the display module 400 of FIGS. 4A, 5A, and 5B and the housing 310 may further be included. The fifth sealing member 465 may be disposed along a border of the window 410, and may have a portion contacting a border of the window 410 and may have a portion disposed on a portion of the housing 310. The fifth sealing member 465 may fill at least a portion of a space between the window 410 and the housing 310. According to various embodiments, the fifth sealing member 465 may be formed in a closed curve shape along an inner surface of the housing 310.

According to various embodiments, the fifth sealing member 465 may fill a space between a stepped portion between the window 410 and the display 420, and the housing 310. According to various embodiments, the electronic device can reduce a width of a black matrix formed on a border of the window, and can reinforce adhesiveness of the display module 400 by applying the fifth sealing member 465. According to various embodiments, the fifth sealing member 465 may fill a gap between the window 410 and the housing 310, thereby preventing and/or reducing inflow of foreign substances and improving waterproof performance.

According to various embodiments, the fifth sealing member 465 may be disposed in a stepped portion formed on a border of the display 420 and a border of the window 410. The fifth sealing member 465 may be formed in contact with side surfaces of the display 420 and the second sealing portion 462. According to an embodiment, the fifth sealing member 465 may be spaced apart from the side surfaces of the display 420 and the second sealing portion 462 by a predetermined distance.

According to various embodiments, the sealing member mentioned in various embodiments, such as the first sealing member 700, the second sealing member 460, a third sealing member (for example, a third sealing member 950 of FIG. 9), the fourth sealing member 450, and the fifth sealing member 465, may include, for example, and without limitation, an adhesive, a tape, dispensing, or the like. The sealing member may be formed with, for example, and without limitation, one or more of an adhesive including a wet-type adhesive material, a thermosetting material, a UV curing material, a pressure sensitive thermal reaction tape, dispensing including a thermosetting material or a thermoplastic material, or a combination of at least two of the above-mentioned materials.

According to various embodiments, when the fifth sealing member 465 is disposed, a portion of the first sealing member 700, the second sealing member 460, the third sealing member 950, or the fourth sealing member 450 may be omitted. For example, although the first sealing member 700 disposed on the second substrate area 560 is omitted, the fifth sealing member 465 disposed on a border adjacent to the second substrate area 560 may fill a gap between the window 410 and the housing 310 and may perform a function of the first sealing member 700.

Referring to FIGS. 6 and 7, in an embodiment, a portion (for example, the second substrate area 560) connecting between the display panel 422 and the FPCB 430 may be bent, and, when viewed above the rear surface 410b of the window 410, a portion of the second substrate area 560 may be disposed to overlap the first substrate area 550. According to an embodiment, a portion of the second substrate area 560 may be attached to the fourth sealing member 450, such that the bent state of the second substrate area 560 can be maintained. The first sealing member 700, the fourth sealing member 450, and the second sealing member 460 may be connected with one another by the third sealing member, which will be described below, and may form a closed curve along the border of the electronic device. The first sealing member 700, the fourth sealing member 450, and the second sealing member 460 may be connected with one another by the third sealing member (for example, the third sealing member 950 of FIG. 9), which will be described below, thereby forming a closed curve and preventing and/or reducing moisture from entering the electronic device. The FPCB 430 connected with the second substrate area 560 may overlap the first substrate area 560 when viewed above the rear surface 410b of the window 410.

Referring to FIGS. 6 and 7, in an embodiment, the display module 400 may include the first sealing member 700 disposed on the second substrate area 560. The first sealing member 700 may be distinguished from the fourth sealing member 450 with the second substrate area 560 therebetween. According to an embodiment, when viewed above the rear surface 410b of the window 410, the first sealing member 700 may be disposed to overlap the fourth sealing member 450 at least in part. For example, when viewed above the rear surface 410b of the window 410, the first sealing member 700 may be extended from one end 7001 disposed adjacent to one end 4612 of the first sealing portion 461 to the other end 7002 disposed adjacent to one end 4622 of the second sealing portion 462. According to an embodiment, when viewed above the rear surface 410b of the window 410, one end 4501 of the fourth sealing member 450 may be disposed between one end 7001 of the first sealing member 700 and one end 4612 of the first sealing portion 461. According to an embodiment, when viewed above the rear surface 410b of the window 410, the other end 4502 of the fourth sealing member 450 may be disposed between the other end 7002 of the first sealing member 700 and one end 4622 of the second sealing portion 462.

Referring to FIGS. 6 and 7, in an embodiment, when viewed above the rear surface 410b of the window 410, the display operating driver 470 may be disposed between the first sealing member 700 and the FPCB 430. According to an embodiment, when viewed above the rear surface 410b of the window 410, the first sealing member 700 may be disposed not to overlap the display operating driver 470. According to an embodiment, the display operating driver 470 may be separated from the fourth sealing member 450 with the second substrate area 560 therebetween. According to an embodiment, when viewed above the rear surface 410b of the window 410, the display operating driver 470 may be disposed to overlap the fourth sealing member 450 at least in part.

Referring to FIGS. 6 and 7, in an embodiment, a coupling portion B (for example, a coupling portion utilizing ACF bonding) between the second substrate area 560 and the FPCB 430 may be disposed between 600 the second sealing member 460 and the first sealing member 700 when viewed above the rear surface 410b of the window 410. For example, when viewed above the rear surface 410b of the window 410, the coupling portion B may be disposed in the proximity of the eighth edge 418 of FIG. 5B (e.g., the fourth edge 414), and the first sealing member 700 may be disposed between the coupling portion B and the eighth edge 418.

Referring to FIGS. 6 and 8, in an embodiment, the display module 400 may be coupled with a support structure 800. According to an embodiment, the support structure 800 may include a side surface bezel structure 810 (for example, the side surface bezel structure 310 of FIG. 3) and a support member 820 (for example, the first support member 311 of FIG. 3). The side surface bezel structure 810 may include a first border 811, a second border 812, a third border 813, and a fourth border 814. The first border 811 and the second border 812 may be disposed on the opposite sides and may be parallel to each other. The third border 813 and the fourth border 814 may be disposed on the opposite sides and may be parallel to each other. The third border 813 may be perpendicular to the first border 811 (e.g., the second border 812), and may connect one end (not shown) of the first border 811 and one end of the second border 812. The fourth border 814 may be perpendicular to the first border 811 (e.g., the second border 812), and may connect the other end (not shown) of the first border 811 and the other end (not shown) of the second border 812. The first border 811 may form a first side surface (not shown) of the electronic device (for example, the electronic device 100 of FIG. 1), and the second border 812 may form a second side surface (not shown) of the electronic device disposed opposite the first side surface. The third border 813 may form a third side surface (not shown) of the electronic device, and the fourth border 814 may form a fourth side surface (not shown) of the electronic device disposed opposite the third side surface. A connection portion (not shown) between the first border 811 and the third border 813, a connection portion (not shown) between the first border 811 and the fourth border 814, a connection portion (not shown) between the second border 812 and the third border 813, and/or a connection portion (not shown) between the second border 812 and the fourth border 814 may form a curved corner side surface.

According to an embodiment, the support member 820 may be connected with the side surface bezel structure 810, or may be integrally formed with the side surface bezel structure 810. For example, the support member 820 may be formed in a plate shape, surrounded by the first border 811, the second border 812, the third border 813, and the fourth border 814, and may include one surface 820a on which the display module 400 of FIG. 6 is disposed, and the other surface (not shown) on which a substrate (for example, the PCB 340 of FIG. 3) is disposed.

According to an embodiment, the support member 820 may include a first area 821, a second area 822, and a third area 823 which face the second sealing member 460 and are attached to the second sealing member 460. The first area 821 may be adjacent to the first border 811 along the first border 811, and may be coupled to the first sealing portion 461 of the second sealing member 460. The second area 822 may be adjacent to the second border 812 along the second border 812, and may be coupled with the second sealing portion 462 of the second sealing member 460. The third area 823 may be adjacent to the third border 813 along the third border 813, and may be coupled with the third sealing portion 463 of the second sealing member 460.

According to an embodiment, the support member 820 may include a fourth area 824 which faces the first sealing member 700 of the display module 400 of FIG. 6, and is coupled with the first sealing member 700. The fourth area 824 may be adjacent to the fourth border 814 along the fourth border 814.

Referring to FIGS. 6 and 8, in an embodiment, the connector 432 formed on one end of the FPCB 430 of the display module 400 may be electrically connected with a connector disposed on a printed circuit board (for example, the PCB 340 of FIG. 3) in which the processor is disposed, through a penetrating hole 820c formed on the support member 820.

Figure 9A:
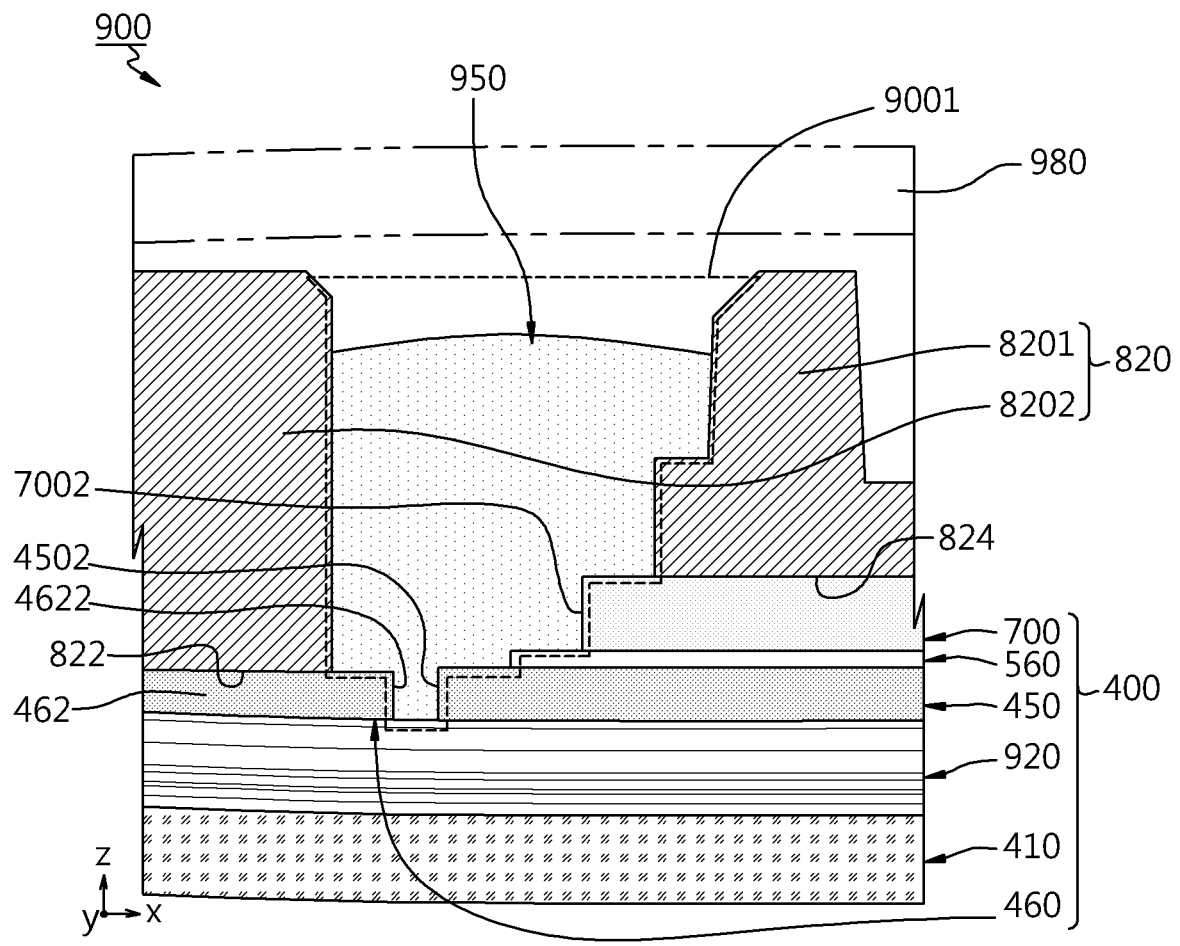
FIG. 9A is a cross-sectional view of a D-D portion of FIG. 6 when the display module of FIG. 6 and the support structure of FIG. 8 are coupled to each other according to an embodiment.
Figure 9B:
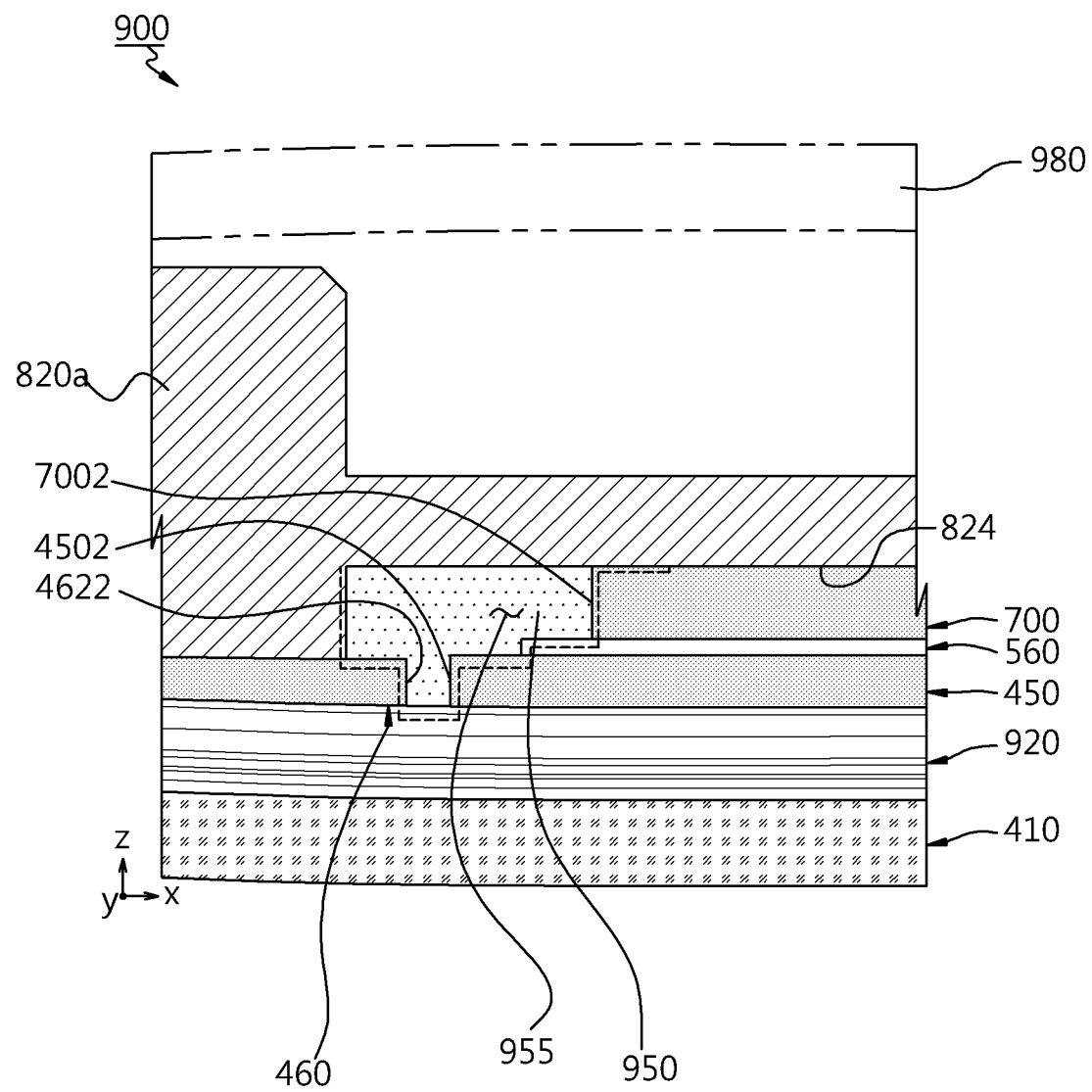
FIG. 9B is a cross-sectional view of the D-D portion of FIG. 6 when the display module of FIG. 6 and the support structure of FIG. 8 are coupled to each other according to an embodiment.

FIG. 9A is a cross-sectional view of a D-D portion of FIG. 6 when the display module of FIG. 6 and the support structure of FIG. 8 are coupled to each other according to an embodiment, and FIG. 9B is a cross-sectional view of the D-D portion of FIG. 6 when the display module of FIG. 6 and the support structure of FIG. 8 are coupled to each other according to an embodiment.

Referring to FIGS. 8 and 9A, in an embodiment, the electronic device 900 may include the display module 400, the support member 820, the third sealing member 950, or a rear surface plate 980.

The display module 400 may include, for example, the window 410, a display 920, the second substrate area 560, the fourth sealing member 450, the second sealing member 460, or the first sealing member 700. The display 920 may be referred to as a component including the display panel 422 and the first substrate area 550 of FIG. 7. The second substrate area 560 may be electrically connected with the display 920, and a portion of the second substrate area 560 may be disposed between the fourth sealing member 450 and the first sealing member 700.

According to an embodiment, the support member 820 may include a first support portion 8201 bonded with the first sealing member 700, and a second support portion 8202 bonded with the second sealing member 460 (for example, the second sealing portion 462). The first sealing member 700 may be disposed on the second substrate area 560 extended from the display 920, and the second sealing portion 462 of the second sealing member 460 may be disposed on a substrate (for example, the substrate 421 of FIG. 5A) of the display 920. The first sealing member 700 may be spaced apart from the display 920 as far as thicknesses of the fourth sealing member 450 and the second substrate area 560. The first sealing member 700 may be disposed on the second substrate area 560, and the second sealing portion 462 of the second sealing member 460 may be disposed on the display 920, and the first sealing member 700 and the second sealing portion 462 may be disposed at different heights, thereby causing a stepped portion between the sealing members and thus causing an empty space. According to various embodiments, it may be difficult to integrally form the first sealing member 700, the second sealing member 460, and the fourth sealing member 450 due to different heights thereof, and accordingly, an empty space may be formed in the support member 820 to allow the third sealing member 950 to be introduced thereinto. To prevent and/or reduce inflow of moisture through the stepped portion or empty space formed between the first sealing member 700 and the second sealing member 460, the third sealing member 950 may be disposed in the empty space.

An empty space may be formed between the first support portion 8201 and the second support portion 8202. For example, the support member 820 may include an opening or a penetrating hole to form the empty space. The support member 820 may be extended from the side surface bezel structure (for example, the side surface bezel structure 310 of FIG. 3). The first support portion 8201 of the support member 820 may be integrally formed with the second support portion 8202, and the first support portion 8201 and the second support portion 8202 may be a portion of the support member 820. The first support portion 8201 may include the fourth area 824 bonded with the first sealing member 700. The second support portion 8202 may include the second area 822 bonded with the second sealing portion 462 of the second sealing member 460.

According to an embodiment, when viewed above the rear surface plate 980 (for example, the rear surface plate 111 of FIG. 2, or the rear surface plate 380 of FIG. 3), one end 7002 of the first sealing member 700 may be disposed to protrude toward the second support portion 8202 relative to the first support portion 8201. According to various embodiments, when viewed above the rear surface plate 980, one end 7002 of the first sealing member 700 may be disposed not to protrude toward the second support portion 8202 relative to the first support portion 8201.

According to an embodiment, when viewed above the rear surface plate 980, the second substrate area 560 may disposed to protrude toward the second support portion 8202 relative to the first sealing member 700.

According to various embodiments (not shown), when viewed above the rear surface plate 980, one end 7002 of the first sealing member 700 may be extended toward the second support portion 8202 to further cover the second substrate area 560. For example, when viewed above the rear surface plate 980, one end 7002 of the first sealing member 700 may be disposed between one end 4502 of the fourth sealing member 450 and the second substrate area 560.

According to an embodiment, the fourth sealing member 450 and the second sealing portion 462 of the second sealing member 460 may be spaced apart from each other on the rear surface of the display 920. For example, when viewed above the rear surface plate 980 (for example, the rear surface plate 111 of FIG. 2, or the rear surface plate 380 of FIG. 3), the fourth sealing member 450 may be extended from one end 4502 spaced apart from one end 4622 of the second sealing portion 462. According to various embodiments (not shown), one end 4502 of the fourth sealing member 450 and one end 4622 of the second sealing portion 462 may be formed in contact with each other.

According to an embodiment, when viewed above the rear surface plate 980, one end 4502 of the fourth sealing member 450 may be disposed to protrude toward the second support portion 8202 relative to the second substrate area 560 or the first sealing member 700. According to an embodiment, when viewed above the rear surface plate 980, one end 4622 of the second sealing portion 462 may be disposed to protrude toward the first support portion 8201 relative to the second support portion 8202. According to various embodiments (not shown), when viewed above the rear surface plate 980, one end 4502 of the fourth sealing member 450 may be disposed not to protrude toward the second support portion 8202 relative to the second substrate area 560. According to various embodiments (not shown), when viewed above the rear surface plate 980, one end 4622 of the second sealing portion 462 may be disposed not to protrude toward the first support portion 8201 relative to the second support portion 8202.

According to an embodiment, due to the coupling between the support member 820 and the display module 400, a recess 9001 which is recessed toward the window 410 from the rear surface plate 980 may be formed. According to an embodiment, the recess 9001 may be a space that becomes narrower toward the window 410 from the rear surface plate 980. For example, when viewed above the rear surface plate 980, at least a portion of the inner surface (not shown) of the recess 9001 may be implemented in a step-like form due to different extending lengths of the stacked components (for example, the fourth sealing member 450, the second sealing member 460, the second substrate area 560, the first sealing member 700, and the support member 820), such that a space becoming narrower toward the window 410 from the rear surface plate 980 can be formed.

Referring to FIGS. 8 and 9A, in an embodiment, the third sealing member 950 may be disposed in the recess 9001. In an embodiment, a cross-sectional structure of an E-E portion of FIG. 6 when the display module 400 of FIG. 6 and the support structure 800 of FIG. 8 are coupled to each other may be substantially similar to or the same as the cross-sectional view of FIG. 9 regarding the D-D portion of FIG. 6, although it is not illustrated, and a detailed description thereof is no provided here. The first sealing member 700, the second sealing member 460, the third sealing member 950, and the fourth sealing member 450 may form a closed-shaped or ring-shaped sealing portion which is disposed between the support member 820 and the display 920 along the side surface bezel structure 810. The closed-shaped or ring-shaped sealing portion may lead to mechanical coupling or sealing between the display 920 and the support member 820.

According to an embodiment, the third sealing member 950 may, for example, be formed with a wet-type sealing material or an optical sealing material. The wet-type sealing material may have enhanced adhesiveness in a wet environment since high molecules (for example, hydrogel) forming a minute structure contact water and expand. The optical sealing material may be a photo-curable resin that is cured in reaction to light of a designated band (for example, ultraviolet rays). The third sealing material 950 may fill the recess 9001 and then may be cured, thereby forming the third sealing member 950. According to an embodiment, the third sealing member 950 may be a cured-in-place gasket (CIPG).

According to an embodiment, the recess 9001 having the space gradually narrower toward the window 410 from the rear surface plate 980 may help the third sealing member 950 fill the recess 9001 without a gap.

According to various embodiments, the third sealing member 950 may be formed with various polymers such as a thermoplastic resin or a thermosetting resin. For example, the third sealing member 950 may be formed with various fillers or a sealant.

According to an embodiment, the rear surface plate 980 may be coupled with the support structure 800 through the fifth sealing member (not shown) such as a double-sided tape or an adhesive. For example, the fifth sealing member may be disposed between a border area (for example, a closed-shaped or ring-shaped area) of the rear surface plate 980 and the support structure 800 to lead to sealing between the rear surface plate 980 and the support structure 800.

Referring to FIGS. 8 and 9B, the electronic device 900 may include the support member 820a extended from the side surface bezel structure (for example, the side surface bezel structure 310 of FIG. 3) adjacent to the rear surface plate 980, the first sealing member 700, the second sealing member 460, the fourth sealing member 450, and the third sealing member 955. Unlike in FIG. 9A, the electronic device 900 may not form an inlet to dispose the third sealing member on ends 4502, 4622, 7002 formed according to arrangements of the first sealing member 700, the second sealing member 460, and the fourth sealing member 450, and may dispose a third sealing member 955 in an empty space, may dispose sealing members in the display module 400, and may seat the display module 400 on the support member 820a.

For example, after the display module including the window 410 and the display 920 is prepared, the first sealing member 700, the second sealing member 460, and the fourth sealing member 450 may be disposed. The third sealing member 955 may be disposed in the space formed by stepped portions 4502, 4622, 7002 formed by the first sealing member 700, the second sealing member 460, and the fourth sealing member 450. The display module 400 having the sealing members formed along the border may be seated on the support member 820a.

According to various embodiments, side surfaces of the window 410 of the display module 400 and the display panel 920, and the housing 310 may include the fifth sealing member 465 as shown in FIG. 5C. In addition, at least one of the first sealing member 700, the second sealing member 460, the fourth sealing member 450, and the third sealing member 955 may be omitted.

Figure 10:
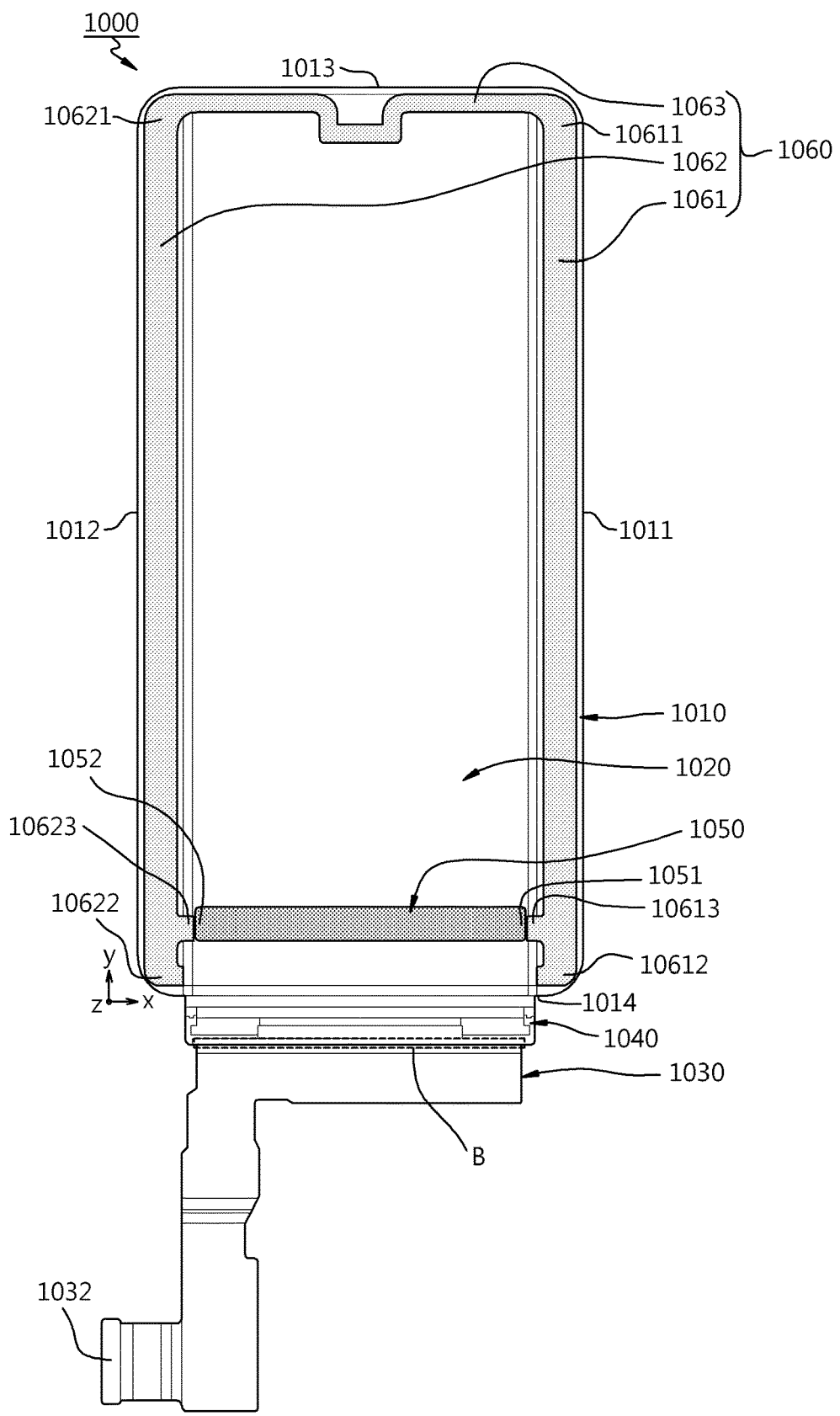
FIG. 10 is a diagram illustrating an example display module according to an embodiment.
Figure 11:
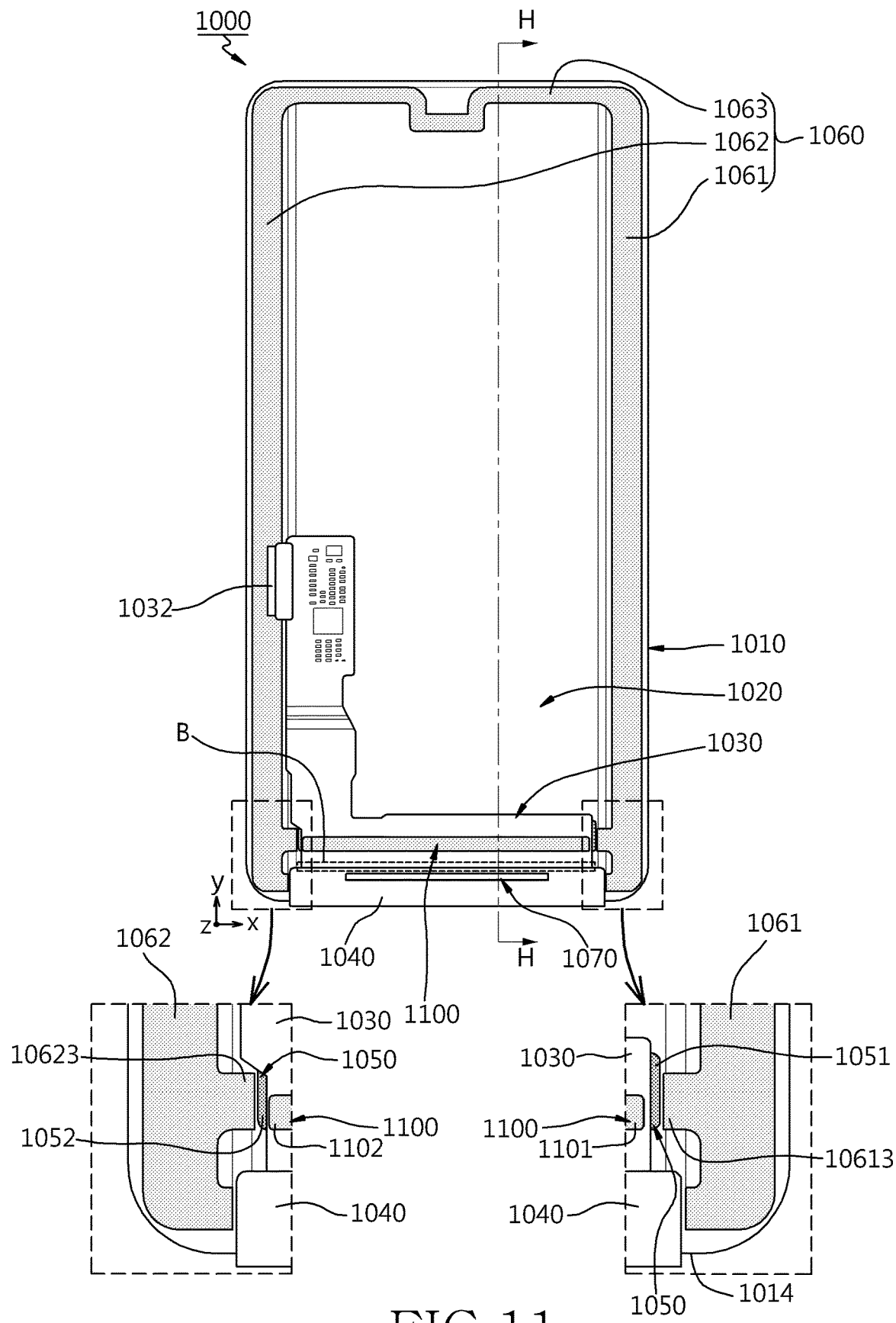
FIG. 11 is a diagram illustrating a second substrate area which is bent and is disposed in the display module of FIG. 10 according to an embodiment.
Figure 12:
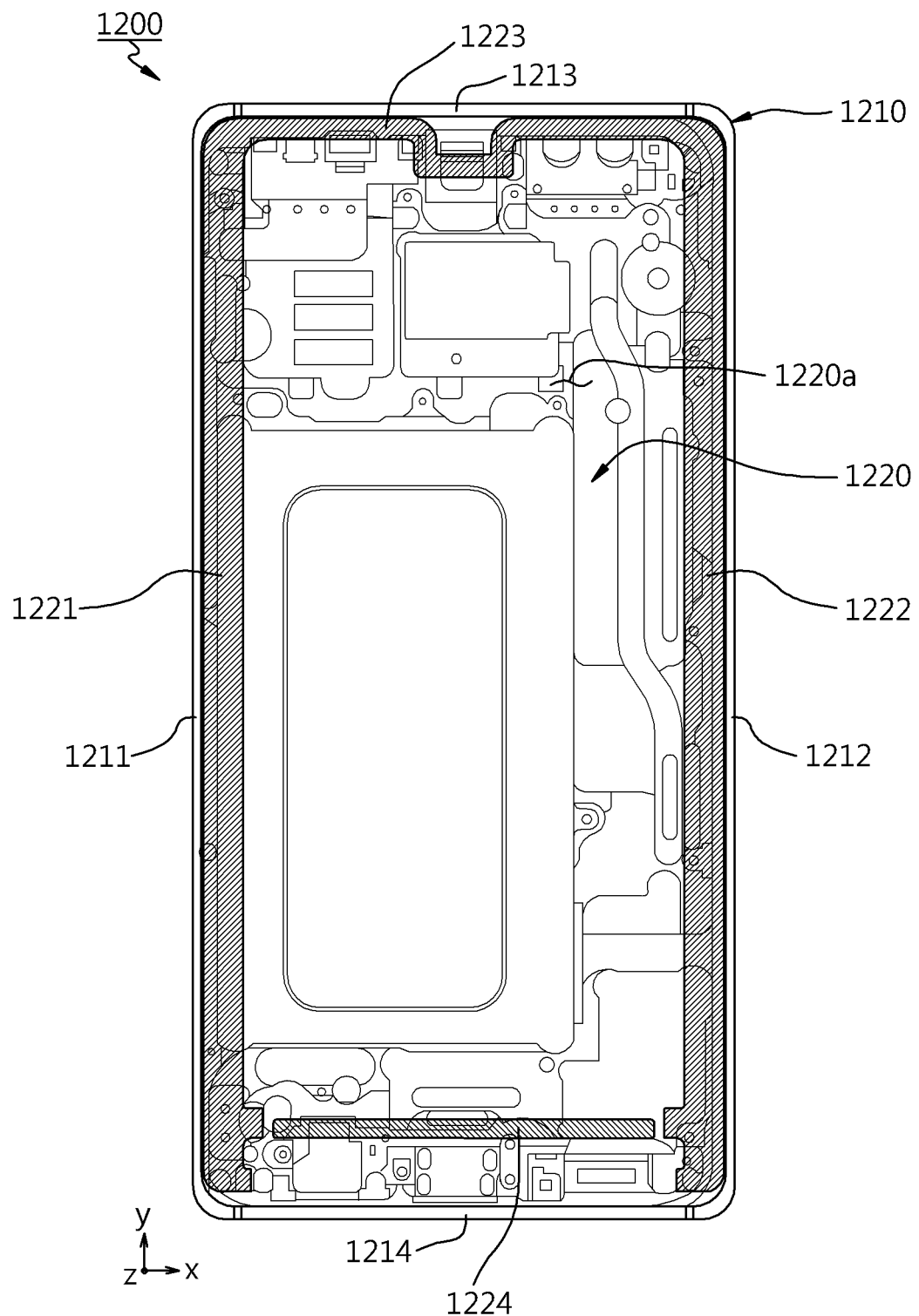
FIG. 12 is a diagram illustrating a support structure to which the display module of FIG. 11 is coupled according to an embodiment.
Figure 13:
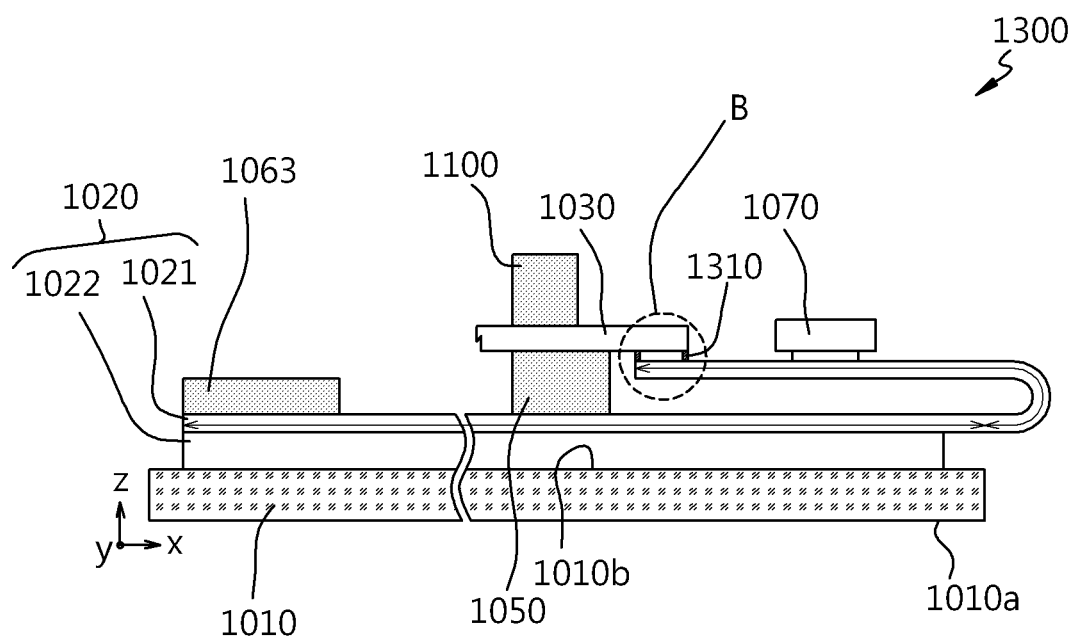
FIG. 13 is a cross-sectional view of an H-H portion in the display module of FIG. 11 according to an embodiment.

FIG. 10 illustrates a display module according to an embodiment. FIG. 11 illustrates the display module of FIG. 10 with a second substrate area being bent and disposed therein according to an embodiment. FIG. 12 illustrates a support structure to which the display module of FIG. 11 is coupled according to an embodiment. FIG. 13 is a cross-sectional view of an H-H portion of the display module of FIG. 11 according to an embodiment.

Referring to FIG. 10, in an embodiment, the display module 1000 may include a window 1010, a display 1020, a first FPCB 1040, a second FPCB 1030, a display operating driver 1070, a fourth sealing member 1050, a second sealing member 1060, or a first sealing member 1100.

The window 1010 may be substantially the same as or similar to the window 410 of FIG. 4A, 4B, 5A, 5B, 5C, 6, or 7, and a detailed description thereof may not be repeated here.

The display 1020 may be substantially the same as or similar to the display 420 of FIG. 4A, 4B, 5A, 5B, 6 or 7 and a detailed description thereof may not be repeated here. The display 1020 may include a substrate (for example, the substrate 421 of FIG. 5A) and a display panel (for example, the display panel 422 of FIG. 5A).

The first FPCB 1040 may connect, for example, the display panel (for example, the display panel 422 of FIG. 5A) and the second FPCB 1030, and may be substantially the same as or similar to the second substrate area 560 of FIG. 4A, 5B, or 7 and a detailed description thereof may not be repeated here.

The second FPCB 1030 may be substantially the same as or similar to the FPCB 430 and the second substrate area 560 of FIG. 4A, 5B, 6, or 7, and a detailed description thereof may not be repeated here. According to an embodiment, the coupling portion B between the second FPCB 1030 and the first FPCB 1040 may be formed through ACF bonding. A connector 1032 (for example, the connector 432 of FIG. 4A) may be disposed on one end of the second FPCB 1030.

The display operating driver 1070 may be substantially the same as or similar to the display operating driver 470 of FIG. 5B, 6, or 7, and a detailed description thereof may not be repeated here. According to an embodiment, the display operating driver 1070 may be disposed on the first FPCB 1040 (for example, the second substrate area 560 of FIG. 5B, 6, or 7) (for example, COP or COF).

According to an embodiment, the second sealing member 1060 may be disposed on a rear surface of the display 1020 along a first edge 1011 of the window 1010 (for example, the first edge 411 or the fifth edge 415 of FIG. 4A), a second edge 1012 (for example, the second edge 412 or the sixth edge 416 of FIG. 4A), and a third edge 1013 (for example, the third edge 413 or the seventh edge 417 of FIG. 4A). The second sealing member 1060 may be integrally formed to include a first sealing portion 1061 (for example, the first sealing portion 461 of FIG. 6) disposed along the first edge 1011 of the window 1010, a second sealing portion 1062 (for example, the second sealing portion 462 of FIG. 6) disposed along the second edge 1012 of the window 1010, or a third sealing portion 1063 (for example, the third sealing portion 463 of FIG. 6) disposed along the third edge 1013 of the window 1010. According to an embodiment, the second sealing member 1060 may include a sealing member including various adhesive materials such as a double-sided tape.

According to an embodiment, the third sealing portion 1063 may connect one end 10611 of the first sealing portion 1061 and one end 10621 of the second sealing portion 1062. A portion where the first sealing portion 1061 and the third sealing portion 1063 are connected to each other may be rounded along a first corner (for example, a portion where the first edge 1011 and the third edge 1013 are connected to each other) of the window 1010. A portion where the second sealing portion 1062 and the third sealing portion 1063 are connected to each other may be rounded along a second corner (for example, a portion where the second edge 1012 and the third edge 1013 are connected to each other) of the window 1010. The other end 10612 of the first sealing portion 1061 may be extended to a third corner (for example, a portion where the first edge 1011 and a fourth edge 1014 are connected to each other) of the window 1010. The other end 10622 of the second sealing portion 1062 may be extended to a fourth corner (for example, a portion where the second edge 1012 and the fourth edge 1014 are connected to each other) of the window 1010.

According to an embodiment, when viewed above the display 1020, the first sealing portion 1061 may include a first protrusion 10612 protruding toward the second edge 1012 from a position closer to the other end 10612 than to one end 10611. According to an embodiment, when viewed above the display 1020, the second sealing portion 1062 may include a second protrusion 10623 protruding toward the first edge 1011 from a position closer to the other end 10622 than to one end 10621. According to an embodiment, the fourth sealing member 1050 may be disposed on the rear surface of the display 1020 between the first protrusion 10613 of the first sealing portion 1061 and the second protrusion 10623 of the second sealing portion 1062. According to an embodiment, the fourth sealing member 1050 may be extended from one end 1051 disposed adjacent to the first protrusion 10613 to the other end 1052 disposed adjacent to the second protrusion 10623. According to an embodiment, the fourth sealing member 1050 may include a sealing member including various adhesive materials such as a double-sided tape.

According to an embodiment, one end 1051 of the fourth sealing member 1050 may be disposed to be spaced apart from the first protrusion 10613 of the first sealing portion 1061. According to various embodiments (not shown), one end 1051 of the fourth sealing member 1050 may be disposed in contact with the first protrusion 10613 of the first sealing portion 1061. According to an embodiment, the other end 1052 of the fourth sealing member 1050 may be disposed to be spaced apart from the second protrusion 10623 of the second sealing portion 1062. According to various embodiments (not shown), the other end 1052 of the fourth sealing member 1050 may be disposed in contact with the second protrusion 10623 of the second sealing portion 1062.

According to various embodiments (not shown), the first protrusion 10613 of the first sealing portion 1061 and/or the second protrusion 10623 of the second sealing portion 1062 may be omitted.

Referring to FIGS. 10 and 11, in an embodiment, the first FPCB 140 connecting between the display 1020 and the second FPCB 1030 may be bent, such that the second FPCB 1030 overlaps the display 1020 when viewed above the display 1020. According to an embodiment, the second FPCB 1030 may be attached to the fourth sealing member 1050, such that the bent state of the first FPCB 1040 can be maintained.

Referring to FIG. 11, in an embodiment, the first sealing member 1100 may be disposed on the second FPCB 1030. The first sealing member 1100 may be distinguished from the fourth sealing member 1050 with the second FPCB 1030 therebetween. According to an embodiment, when viewed above the display 1020, the first sealing member 1100 may be disposed to overlap the fourth sealing member 1050 at least in part. The first sealing member 1100 may be extended from one end 1101 adjacent to the first protrusion 10613 to the other end 1102 adjacent to the second protrusion 10623 when viewed above the display 1020. According to an embodiment, when viewed above the display 1020, one end 1051 of the fourth sealing member 1050 may be disposed between one end 1101 of the first sealing member 1100 and the first protrusion 10613 of the first sealing portion 1061. According to an embodiment, when viewed above the display 1020, the other end 1052 of the fourth sealing member 1050 may be disposed between the other end 1102 of the first sealing member 1100 and the second protrusion portion 10623 of the second sealing portion 1062.

Referring to FIG. 11, in an embodiment, the display operating driver 1070 may be disposed between the fourth edge 1014 of the window 1010 and the first sealing member 1100 when viewed above the display 1020.

According to an embodiment, the coupling portion B between the first FPCB 1040 and the second FPCB 1030 may be disposed between the first sealing member 1100 and the display operating driver 1070 when viewed above the display 1020.

Referring to FIG. 12, a support structure 1200 may include a side surface bezel structure 1210 (for example, the side surface bezel structure 310 of FIG. 3 or the side surface bezel structure 810 of FIG. 8), and a support member 1220 (for example, the first support member 311 of FIG. 3 or the support member 820 of FIG. 8). The side surface bezel structure 1210 may include a first border 1211 (for example, the first border 811 of FIG. 8), a second border 1212 (for example, the second border 812 of FIG. 8), a third border 1213 (for example, the third border 813 of FIG. 8), and a fourth border 1214 (for example, the fourth border 814 of FIG. 8). The support member 1220 may be connected with the side surface bezel structure 1210 or may be integrally formed with the side surface bezel structure 1210. For example, the support member 1220 may be formed in a plate shape, surrounded by the first border 1211, the second border 1212, the third border 1213, and the fourth border 1214, and may include one surface 1220a on which the display module 1000 of FIG. 11 is disposed, and the other surface (not shown) on which a printed circuit board (for example, the PCB 340 of FIG. 3) is disposed.

According to an embodiment, the support member 1220 may include a first area 1221, a second area 1222, and a third area 1223 which face the second sealing member 1060 of the display module 1000 of FIG. 11, and are coupled with the second sealing member 1060. The first area 1221 may be adjacent to the first border 1211 along the first border 1211, and may be coupled with the first sealing portion 1061 of the second sealing member 1060. The second area 1222 may be adjacent to the second border 1212 along the second border 1212, and may be coupled with the second sealing portion 1062 of the second sealing member 1060. The third area 1223 may be adjacent to the third border 1213 along the third border 1213, and may be coupled with the third sealing portion 1063 of the second sealing member 1060.

According to an embodiment, the support member 1220 may include a fourth area 1224 which faces the first sealing member 1100 of the display module 1000 of FIG. 11 and is coupled with the first sealing member 1100.

Referring to FIGS. 11, 12, and 13, in an embodiment, the electronic device 1300 may include the display module 1000, the support member 1220, a third sealing member 1350, or a rear surface plate 1380 (for example, the rear surface plate 111 of FIG. 2, or the rear surface plate 380 of FIG. 3).

The display module 1000 may include, for example, the window 1010, the display 1020, the second FPCB 1030, the fourth sealing member 1050, the second sealing member 1060, or the first sealing member 1100.

According to an embodiment, the support member 1220 may include a first support portion 1225 coupled with the first sealing member 1100, and a second support portion 1226 coupled with the second sealing member 1060 (for example, the second sealing portion 1062). An empty space may be formed between the first support portion 1225 and the second support portion 1226. For example, the support member 1220 may include an opening or a penetrating hole forming the empty space. The first support portion 1225 may include the fourth area 1224 coupled with the first sealing member 1100. The second support portion 1226 may include the second area 1222 coupled with the second sealing portion 1062 of the second sealing member 1060.

In the cross-sectional structure shown in FIG. 9, the second substrate area 560 may be disposed between the fourth sealing member 450 and the first sealing member 700. According to an embodiment, the second FPCB 1030 may be disposed between the fourth sealing member 1050 and the first sealing member 1100 unlike the cross-sectional structure of FIG. 9.

For example, due to the coupling between the support member 1220 and the display module 1000, a recess which is recessed toward the window 1010 from the rear surface plate may be formed. According to an embodiment, the recess may be a space which becomes narrower toward the window 1010 from the rear surface plate. For example, due to different extending lengths of the stacked components (for example, the fourth sealing member 1050, the second sealing member 1060, the second FPCB 1030, the first sealing member 1100, and the support member 1220) when viewed above the rear surface plate, at least a portion of the inner surface (not shown) of the recess may be implemented in a step-like shape, such that a space becoming narrower toward the window 1010 from the rear surface plate is formed.

Referring to FIGS. 11, 12, and 13, in an embodiment, the third sealing member (not shown) may be disposed in the recess. The first sealing member 1100, the second sealing member 1060, the third sealing member (not shown), and the fourth sealing member 1050 may form a closed-shaped or ring-shaped sealing portion disposed between the support member 1220 and the display 1020. The closed-shaped or ring-shaped sealing portion may lead to mechanical coupling and sealing between the display 1020 and the support member 1220. Referring to FIGS. 11 and 13, a display panel 1022 of the display 1020 and a substrate 1021 attached to the display panel 1022 may be included. The substrate 1021 may include a soft material, such that the substrate 1021 can be bent on a border portion of the display panel 1022, and an end of the substrate 1021 (for example, an end of the first FPCB 1040 of FIG. 11) may be coupled with the second FPCB 1030 on the coupling portion B. When viewed above the display 1020, the coupling portion B between the first FPCB 1040 and the second FPCB 1030 may be disposed outside the closed-shaped or ring-shaped sealing portion. The coupling portion B formed outside the closed-shaped or ring-shaped sealing portion may be vulnerable to waterproofing. For example, when moisture or foreign substances flow from the outside of the electronic device, the moisture or foreign substances can be prevented and/or reduced from flowing into the electronic device due to the closed-shaped or ring-shaped sealing portion, but the coupling portion B may be exposed to the Foreign substances or moisture. According to an embodiment, the coupling portion B may be sealed by utilizing various types of sealing members 1310. For example, the coupling portion B may be sealed through the sealing member 1310 using tape coating, resin coating, coating, as a sealing member covering a bonding portion. Interfaces of the coupling portion B, the first FPCB 1040, and the second FPCB 1030 may be vulnerable to waterproofing. The coupling portion B vulnerable to waterproofing may be additionally waterproofed. For example, a waterproof structure formed on a wider area than the coupling portion B may surround the coupling portion B. In another example, both surfaces of the coupling portion B may be waterproofed and can prevent and/or reduce moisture from entering along the interface of the coupling portion B.

Figure 14:
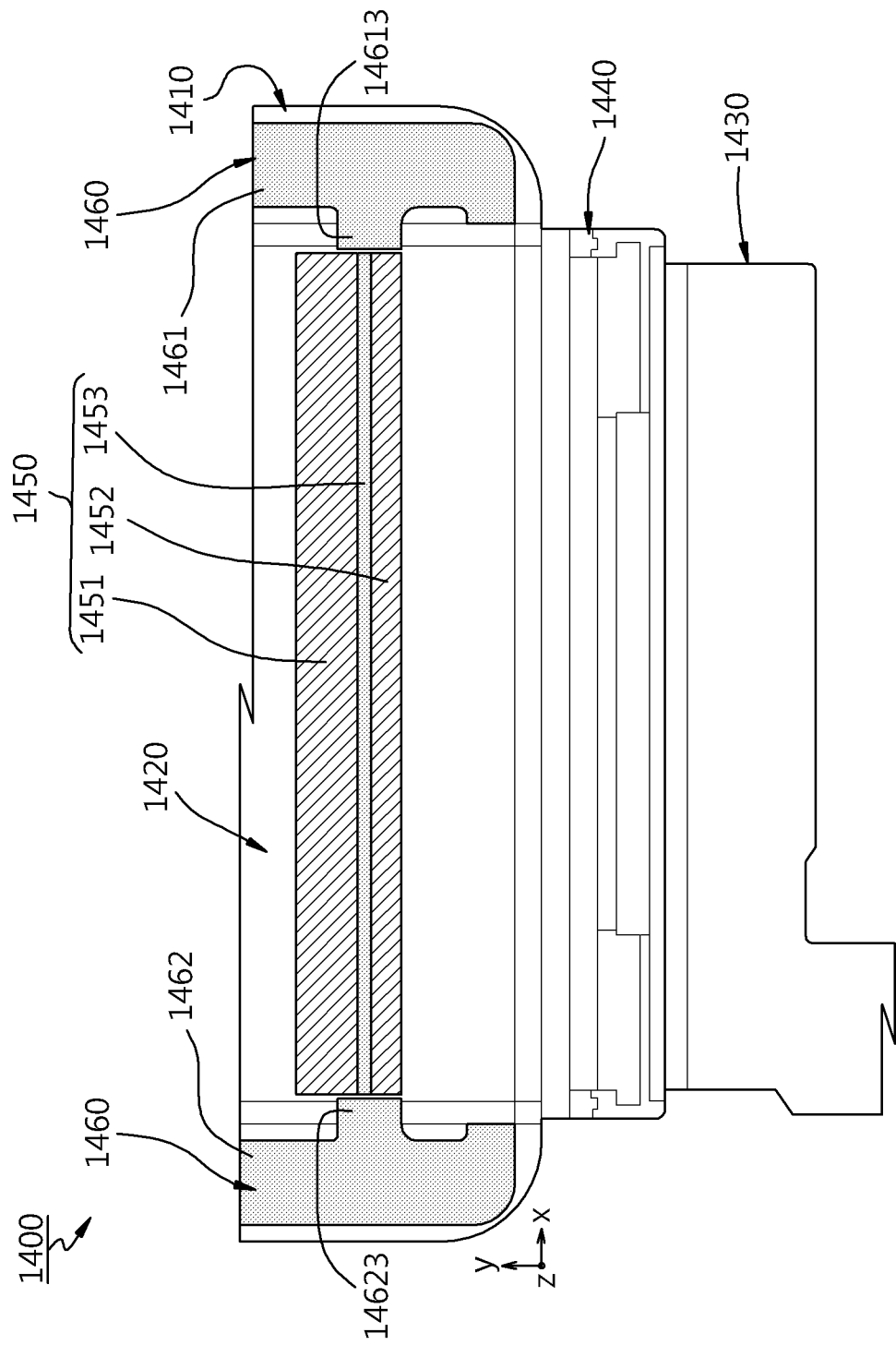
FIG. 14 is a diagram illustrating an example display module according to an embodiment.

FIG. 14 is a diagram illustrating an example display module according to an embodiment.

Referring to FIG. 14, the display module 1400 may include a window 1410 (for example, the window 1010 of FIG. 10), a display 1420 (for example, the display 1020 of FIG. 10), a first FPCB 1440 (for example, the first FPCB 1040 of FIG. 10), a second FPCB 1430 (for example, the second FPCB 1030 of FIG. 10), a fourth sealing member 1450, or a second sealing member 1460 (for example, the second sealing member 1060 of FIG. 10). The display module 1400 may be implemented by substituting the first sealing member 1061 of the display module 1000 of FIG. 10 with the fourth sealing member 1450 of a different shape. The other components are substantially the same as or similar to those described in FIG. 10, and a detailed description thereof may not be repeated here.

According to an embodiment, when viewed above the display 1420, the fourth sealing member 1450 may be disposed between a first protrusion 14613 (for example, the first protrusion 10613 of FIG. 10) of a first sealing portion 1461 (for example, the first sealing portion 1061 of FIG. 10), and a second protrusion 14623 (for example, the second protrusion 10623 of FIG. 10) of a second sealing portion 1462 (for example, the second sealing portion 1062 of FIG. 10). According to an embodiment, the fourth sealing member 1450 may include a first attachment member 1451, a second attachment member 1452, and a coupling member 1453. The coupling member 1453 may be disposed between the first attachment member 1451 and the second attachment member 1452. For example, after the first attachment member 1451 and the second attachment member 1452 are disposed on a rear surface of the display 1420, the coupling member 1453 may be formed between the first attachment member 1451 and the second attachment member 1452. The first attachment member 1451 and the second attachment member 1452 may be, for example, a double-sided tape, and a polymer such as a thermoplastic resin or a thermosetting resin for forming the coupling member 1453 may be coated between the first attachment member 1451 and the second attachment member 1452. The first attachment member 1451 and the second attachment member 1452 may guide an area to be coated with the polymer for forming the coupling member 1453. For example, the first FPCB 1440 may be bent, and the second FPCB 1430 may be attached to the first attachment member 1451 and the second attachment member 1452 disposed in the display 1420. For example, the coupling member 1453 including a thermoplastic resin may be heated and cured, and the second FPCB 1430 and the display 1420 may be coupled to each other by the coupling member 1453. For example, the coupling member 1453 including a thermosetting resin may be heated and cured, and the second FPCB 1430 and the display 1420 may be coupled to each other by the coupling member 1453. The first attachment member 1451 and the second attachment member 1452 may provisionally attach the second PFCB 1430 to the rear surface of the display 1420 before being coupled to each other through the coupling member 1453.

FIGS. 15, 16, 17A and 17B are diagrams illustrating an example display module according to various embodiments.

Figure 15:
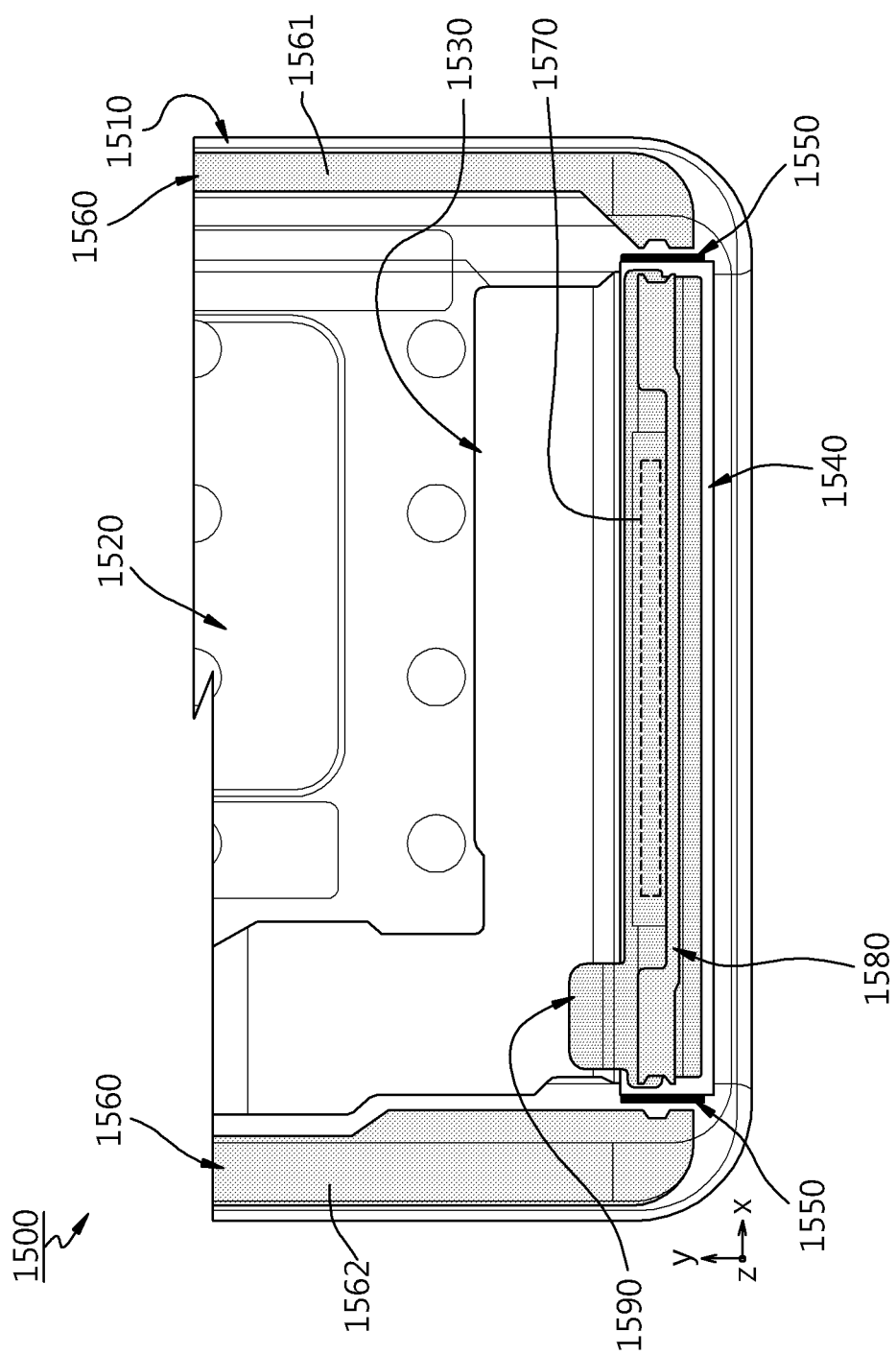
FIG. 15 is a diagram illustrating an example display module according to various embodiments.

Referring to FIG. 15, the display module 1500 may include a window 1510 (for example, the window 410 of FIG. 6), a display 1520 (for example, the display 420 of FIG. 6), a first FPCB 1540 (for example, the second substrate area 560 of FIG. 4A), a second FPCB 1530 (for example, the FPCB 430 of FIG. 4A), a display operating driver 1570 (for example, the display operating driver 470 of FIG. 6), a first sealing member 1580, a second sealing member 1560 (for example, the second sealing member 460 of FIG. 6), a fourth sealing member 1550 (for example, the fourth sealing member 450 of FIG. 6), or a sheet 1590. The fourth sealing member 1550 may be disposed between a first sealing portion 1561 and a second sealing portion 1562. The display module 1500 may be implemented by adding the sheet 1590 in the display module 400 of FIG. 6, and the other components are substantially the same as or similar to those of FIG. 6 and thus a detailed description thereof may not be repeated here.

According to an embodiment, the sheet 1590 may be disposed on the first FPCB 1540 to overlap the display 1520 when viewed above the display 1520. According to an embodiment, when viewed above the display 1520, the sheet 1590 may cover at least a portion of the display operating driver 1570 disposed on the first FPCB 1540. The sheet 1590 can protect the display operating driver 1570 from static electricity or an external shock. For example, the sheet 1590 may be a complex sheet implemented with at least one layer of a polymer synthetic resin.

According to an embodiment, the first sealing member 1580 (for example, the first sealing member 700 of FIG. 6) may be disposed on the sheet 1590. According to an embodiment, when viewed above the display 1520, the first sealing member 1580 may be disposed not to overlap the display operating driver 1570.

For example, when the sheet 1590 is separated from the first FPCB 1540 in the display module 1500 shown in FIG. 15, adhesiveness may be degraded due to a gap between the sheet 1590 and the first FPCB 1540. According to an embodiment, compared to the display module 1500 shown in FIG. 15, the display module 1600 shown in FIG. 16 may have a sheet 1690 disposed to cover the display operating driver 1570, but not to overlap the first sealing member 1580.

Figure 16:
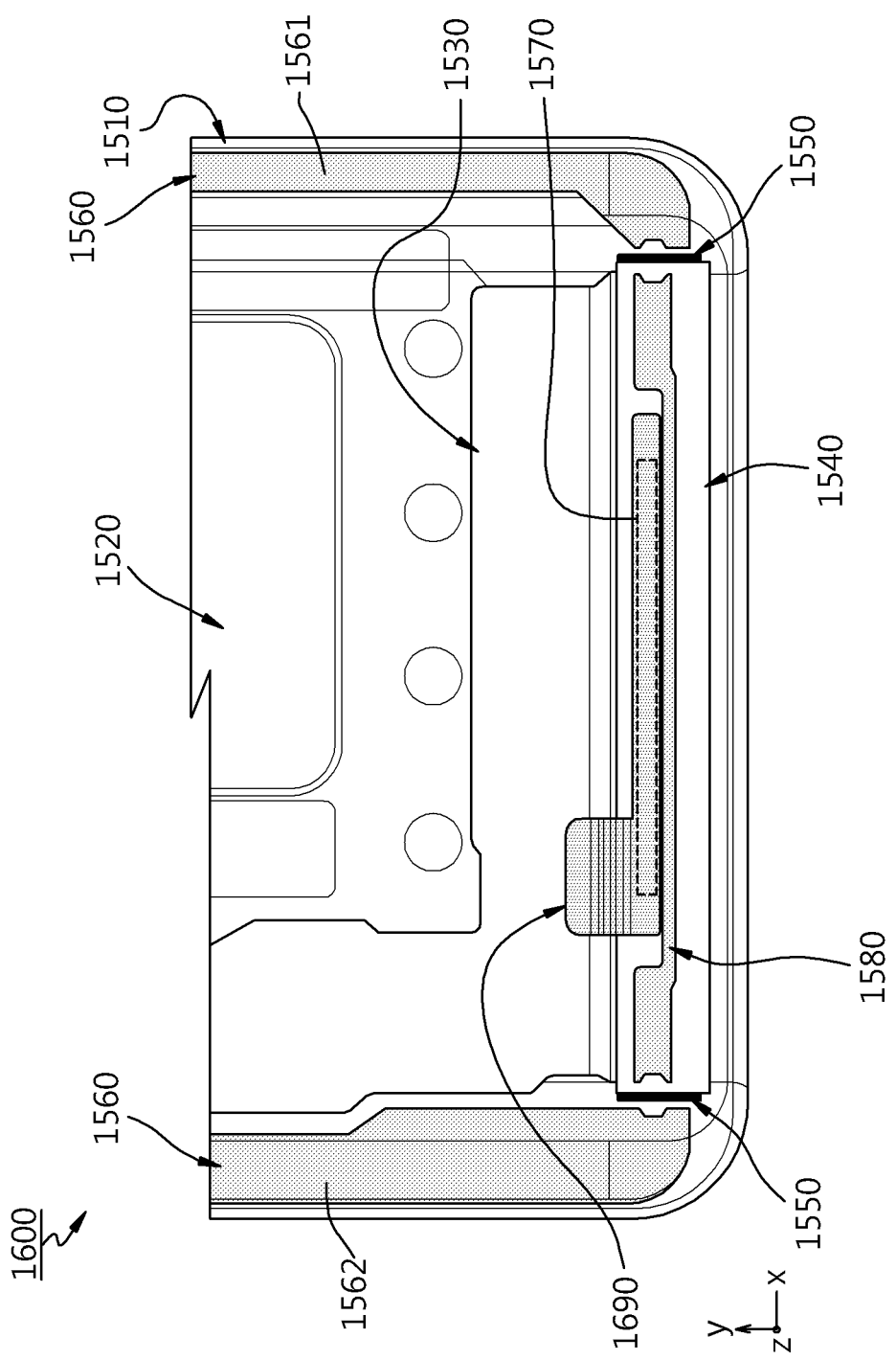
FIG. 16 is a diagram illustrating an example display module according to various embodiments.

According to an embodiment, in the display module 1600 shown in FIG. 16, the first sealing member 1580 may be disposed on the first FPCB 1540, and accordingly, the problem that adhesiveness is degraded due to separation between the sheet 1590 and the first FPCB 1540 in the display module 1500 shown in FIG. 15 can be addressed.

Figure 17A:
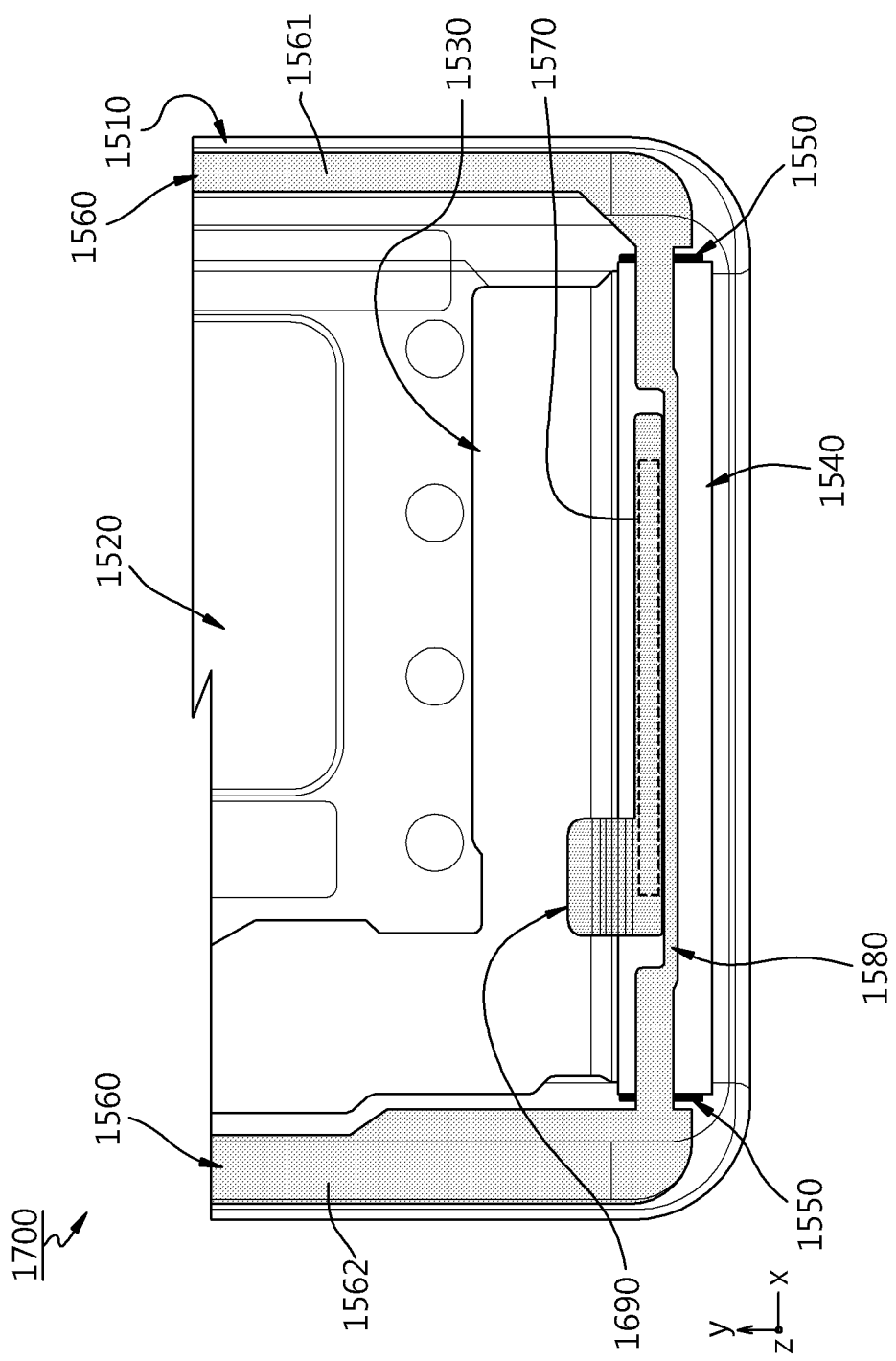
FIG. 17A is a diagram illustrating an example display module according to various embodiments.

According to various embodiments, in the display module 1700 shown in FIG. 17A, the first sealing member 1580 and the second sealing member 1560 may be integrally formed with each other. For example, the second sealing member 1560 formed along three borders of the electronic device may be connected to the first sealing member 1580 formed along the other border of the electronic device, and may be integrally formed therewith. The first sealing member 1580 and the second sealing member 1560 may form a closed curve line, and can prevent and/or reduce moisture from entering the inside of the electronic device.

Figure 17B:
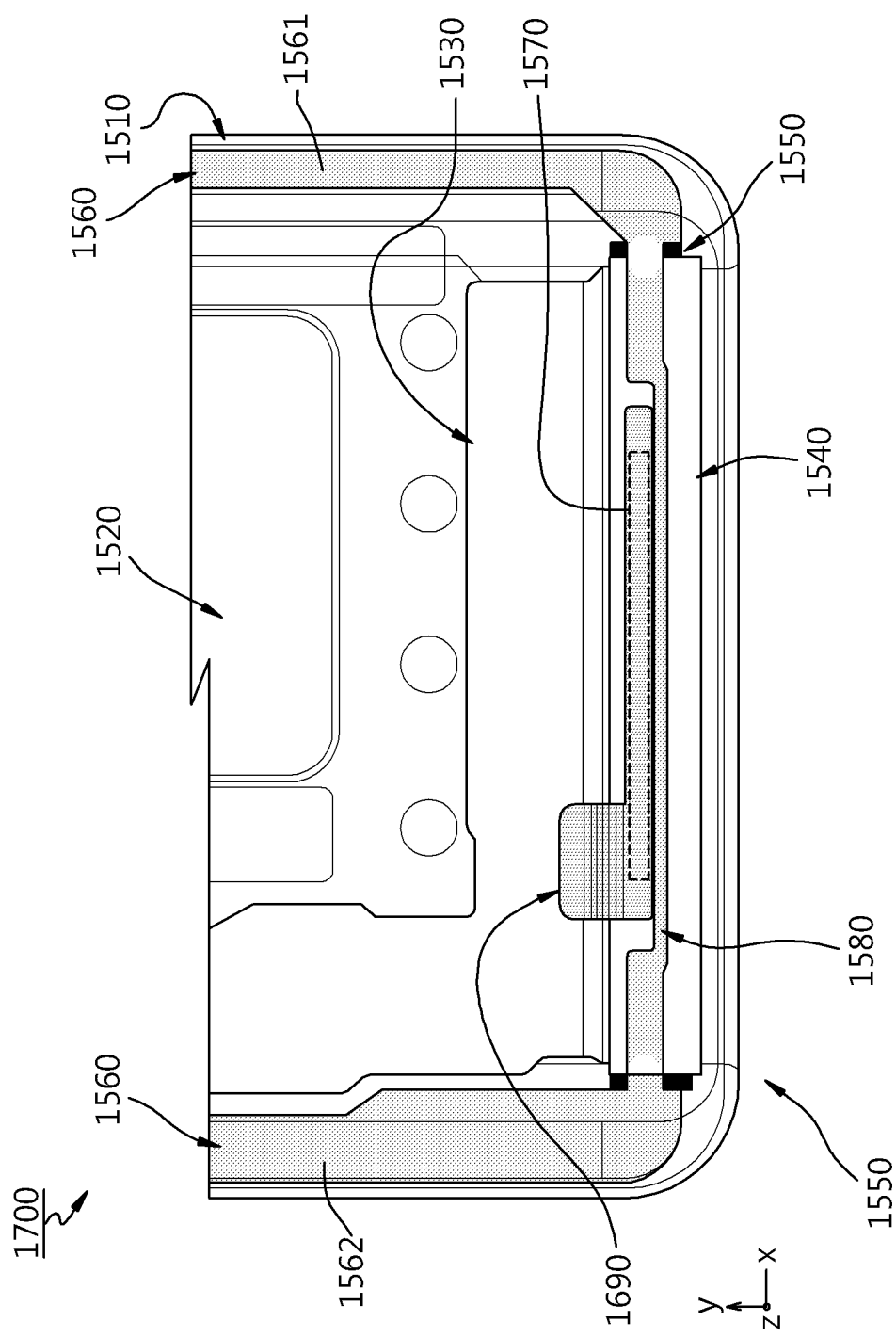
FIG. 17B is a diagram illustrating an example display module according to various embodiments.

According to an embodiment, in the display module 1700 shown in FIG. 17B, the second sealing member 1560 and the fourth sealing member 1550 may be connected, thereby forming a closed curved line. Ends of the second sealing member 1560 may be connected to the fourth sealing member 155 formed along a border formed between ends. According to an embodiment, the second sealing member 1560 and the fourth sealing member 1550 formed on the same plane may be integrally formed with each other.

Figure 18:
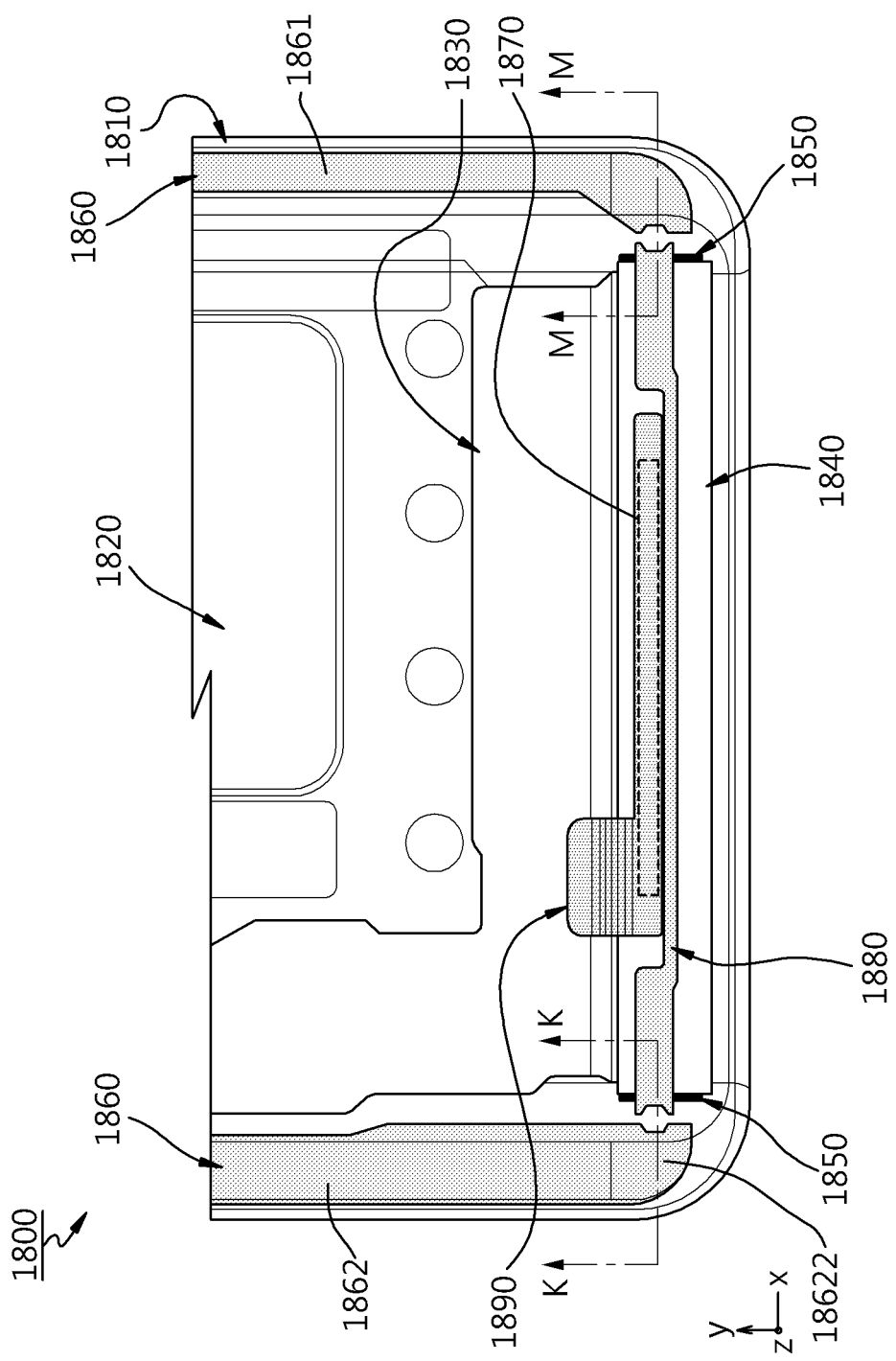
FIG. 18 is a diagram illustrating an example display module according to various embodiments.
Figure 19:
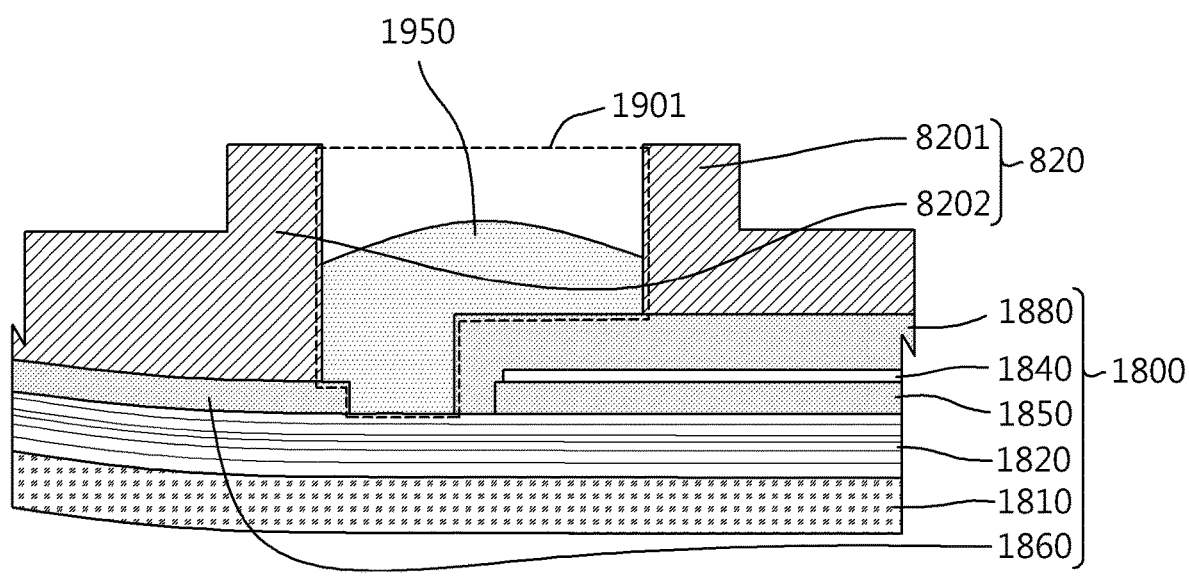
FIG. 19 is a cross-sectional view of a K-K portion of FIG. 18 when the display module of FIG. 18 and the support structure of FIG. 8 are coupled to each other according to an embodiment.

FIG. 18 is a diagram illustrating an example display module according to various embodiments. FIG. 19 is a cross-sectional view of a K-K portion of FIG. 18 when the display module of FIG. 18 and the support structure of FIG. 8 are coupled to each other according to an embodiment.

Referring to FIG. 18, the display module 1800 may include a window 1810 (for example, the window 1510 of FIG. 16), a display 1820 (for example, the display 1520 of FIG. 16), a first FPCB 1840 (for example, the first FPCB 1540 of FIG. 16), a second FPCB 1830 (for example, the FPCB 1530 of FIG. 16), a display operating driver 1870 (for example, the display operating driver 1570 of FIG. 16), a first sealing member 1880, a second sealing member 1860 (for example, the second sealing member 1560 of FIG. 16), a fourth sealing member 1850 (for example, the fourth sealing member 1550 of FIG. 16), or a sheet 1890 (for example, the sheet 1590 of FIG. 16).

Referring to FIGS. 18 and 19, in an embodiment, the display module 1800 may be coupled to the support member 820. According to an embodiment, the display module 1800 may be implemented by further extending the first sealing member 1880 in the display module 1600 of FIG. 16, and the other components are substantially the same as or similar to those of FIGS. 16 and 17A and thus a detailed description thereof may not be repeated here. The cross-sectional structure shown in FIG. 19 may include a recess 1901 and a third sealing member 1950 disposed in the recess 1901.

According to an embodiment, although the cross-sectional structure of an M-M portion of FIG. 18 when the display module 1800 of FIG. 18 and the support structure 800 of FIG. 8 are coupled to each other is not illustrated, it is substantially the same as or similar to the cross-sectional structure shown in FIG. 19, and a detailed description thereof may not be repeated here. The first sealing member 1880, the second sealing member 1860, the third sealing member 1950, and the fourth sealing member 1850 may form a closed-shaped or ring-shaped sealing portion disposed between the support member 820 and the display 1820. The closed-shaped or ring-shaped sealing portion may lead to mechanical coupling and sealing between the display 1820 and the support member 820.

In FIG. 9, the sealing performance may be improved to address potential separation between the third sealing member 950 and the first substrate area 560. According to an embodiment, the first sealing member 1880 of FIGS. 18 and 19 may further be extended toward one end 18622 of a second sealing portion 1862, thereby covering the first FPCB 1840. A coupling interface between a third sealing member 1750 and the first FPCB 1540 can be reduced, and a coupling area between the first sealing member 1880 and the third sealing member 1850 can increase as shown in FIG. 17.

Figure 20:
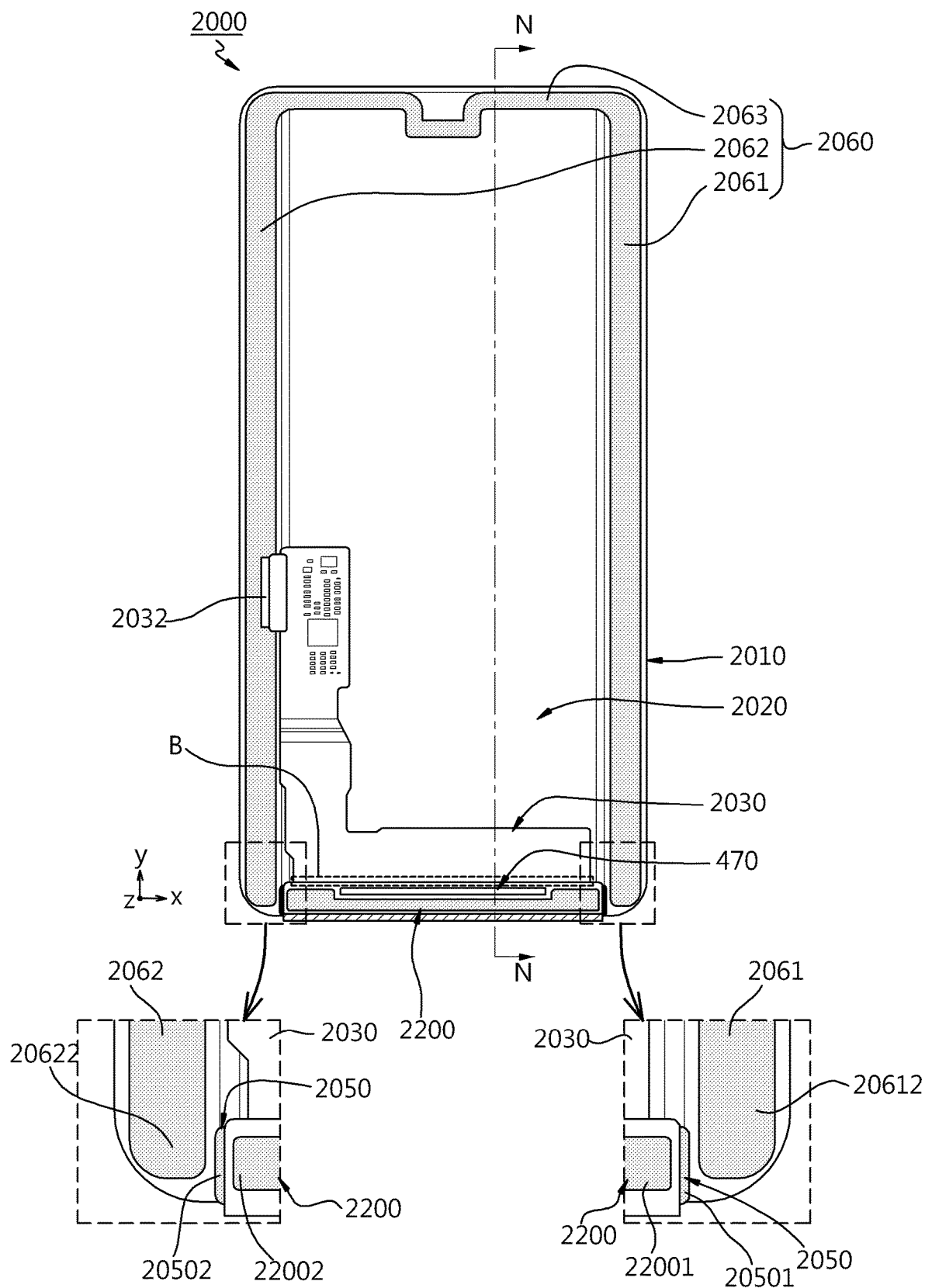
FIG. 20 is a diagram illustrating an example display module according to an embodiment.
Figure 21:
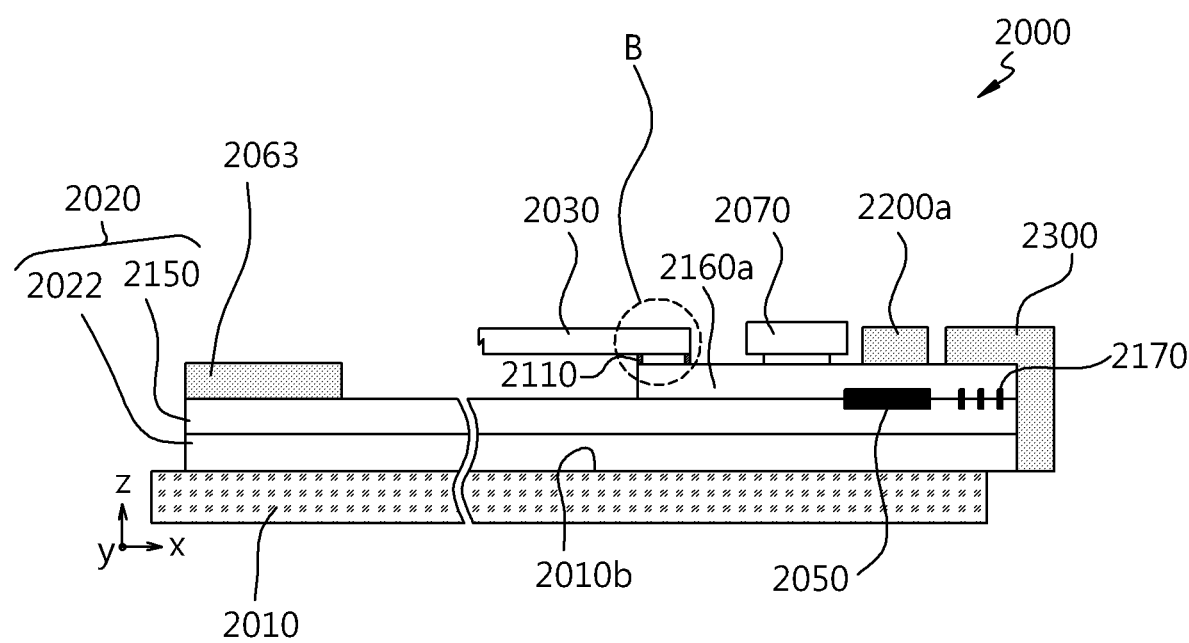
FIG. 21 is a cross-sectional view of an N-N portion of FIG. 20 according to an embodiment.
Figure 22:
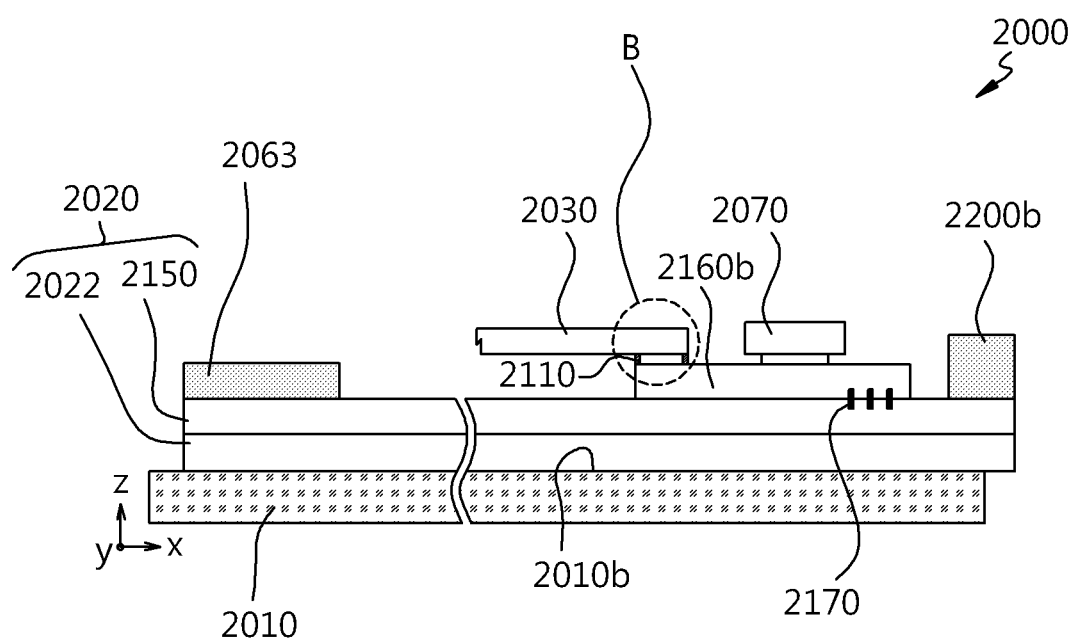
FIG. 22 is a cross-sectional view of the N-N portion of FIG. 20 according to an embodiment.

FIG. 20 is a diagram illustrating an example display module according to an embodiment. FIGS. 21 and 22 are cross-sectional views of an N-N portion of FIG. 20 according to an embodiment.

Referring to FIGS. 20 and 21, in an embodiment, a first sealing member 2200 may be disposed on a second FPCB 2030. The first sealing member 2200 may be distinguished from a fourth sealing member 2050 with the second FPCB 2030 therebetween. According to an embodiment, when viewed above a display 2020, the first sealing member 2200 may be disposed to overlap the fourth sealing member 2050 at least in part. When viewed above the display 2020, the first sealing member 2200 may be extended from one end 22001 adjacent to a first protrusion 20612 to the other end 22002 adjacent to a second protrusion 20622. According to an embodiment, when viewed above the display 1020, one end 20501 of the fourth sealing member 2050 may be disposed between one end 22001 of the first sealing member 2200 and the first protrusion 20612 of a first sealing portion 2061. According to an embodiment, when viewed above the display 2020, the other end 20502 of the fourth sealing member 2050 may be disposed between the other end 22002 of the first sealing member 2200 and the second protrusion 20622 of a second sealing portion 2062.

Referring to FIG. 21, in an embodiment, a display operating driver 2070 may be disposed between the first sealing member 2200 disposed on a short border of a window 2010, and a coupling portion B when viewed above the display 2020.

The electronic device 2000 may include the display 2020 and an additional substrate 2160a. The display 2020 may include a display panel 2022 and a substrate 2150. The display 2020 may be disposed on the window 2010, and the display panel 2022 may contact the window 2010. The additional substrate 2160a may be disposed on the substrate 2150. The additional substrate 2160a may be disposed to overlap a portion of the substrate 2150. The fourth sealing member 2050 may be disposed between the substrate 2150 and the additional substrate 2160a. A second sealing member 2200a may be disposed on the additional substrate 2160a. The second sealing member 2200a can prevent and/or reduce moisture or foreign substances from entering the coupling portion B disposed between the second FPCB 2030 and the additional substrate 2160a.

According to various embodiments, the substrate 2150 and the additional substrate 2160a may be electrically connected with each other by a conductive via 2170. An additional waterproof structure 2300 may be included on side surfaces of the substrate 2150 and the additional substrate 2160a and a portion of a border of the upper surface of the substrate 2150 to prevent and/or reduce moisture or foreign substances from entering the interfaces of the substrate 2150 and the additional substrate 2160a.

According to various embodiments, the coupling portion B may be sealed through a sealing member 2110 using tape coating, resin coating, coating as a sealing member for covering a bonding portion.

Referring to FIG. 22, the additional substrate 2160b may be disposed closer to the inside than to the border of the substrate 2150, compared in FIG. 21. For example, a stepped portion may be included on side surfaces of the substrate 2150 and the additional substrate 2160b. A first sealing member 2200b may be disposed on the stepped portion of the substrate 2150 and the additional substrate 2160b.

Referring to FIGS. 21 and 22, the coupling portion B may be sealed by utilizing various types of sealing members 2010. For example, the coupling portion B may be sealed through the sealing member 2010 using tape coating, resin coating, coating.

Figure 23:
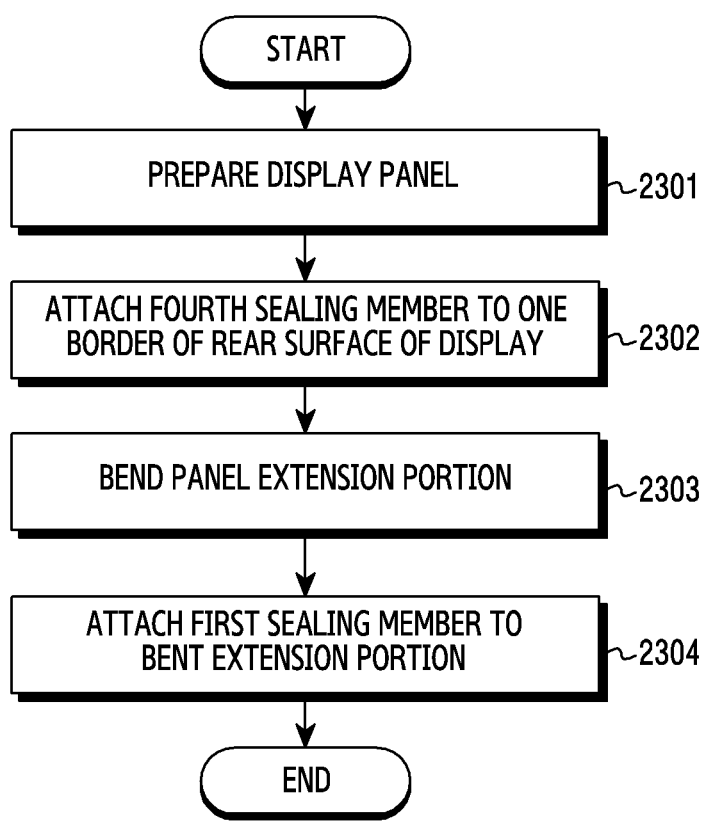
FIG. 23 is a flowchart illustrating an example manufacturing process of a display module according to an embodiment.
Figure 24:
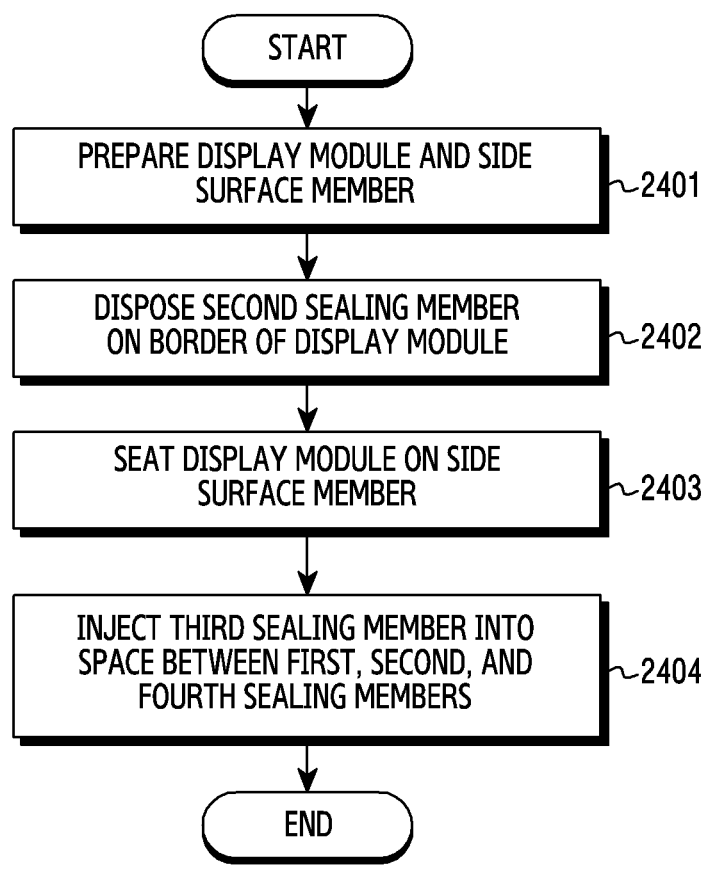
FIG. 24 is a flowchart illustrating an example manufacturing process of an electronic device according to various embodiments.
Figure 25:
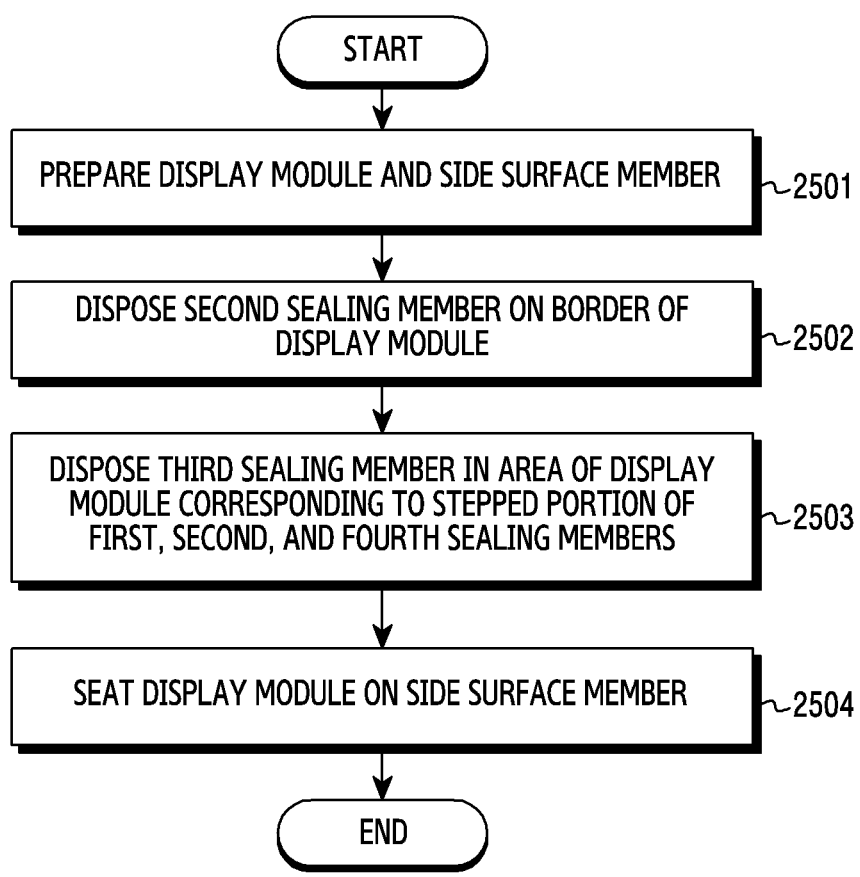
FIG. 25 is a flowchart illustrating an example manufacturing process of an electronic device according to various embodiments.

FIG. 23 is a flowchart illustrating an example manufacturing process of a display module according to an embodiment. FIG. 24 is a flowchart illustrating an example manufacturing process of an electronic device according to various embodiments, and FIG. 25 is a flowchart illustrating an example manufacturing process of an electronic device according to various embodiments.

Referring to FIG. 23, in operation 2301, a display panel (for example, the display panel 422 of FIG. 7) may be prepared. A display module (for example, the display module 420 of FIG. 7) may include the display panel and a substrate (for example, the substrate 421 of FIG. 7). The display panel may be prepared to have a fourth sealing member (for example, the fourth sealing member 450 of FIG. 8) disposed on the display panel.

In operation 2302, the fourth sealing member may be attached to one border (for example, the fourth edge 414 of FIG. 5A) of the rear surface of the display module. In operation 2303, an extension portion of the display panel may be bent. The FPCB (for example, the FPCB 430 of FIG. 7) may be an extension portion that may be electrically connected with the substrate 421. The fourth sealing member may be attached to the rear surface of the display module. The FPCB may be bent, and a portion of the FPCB may be bonded the rear surface of the display by the fourth sealing member.

In operation 2304, a first sealing member (for example, the first sealing member 700 of FIG. 6) may be attached to the bent extension portion. The first sealing member may be attached to overlap at least a portion of the FPCB.

Referring to FIG. 24, in operation 2401, a display module and a side surface member (e.g., a housing) on which the display module is to be seated may be prepared. In operation 2402, a second sealing member (for example, the second sealing member 460 of FIG. 4A) may be disposed on a border of the display module. The second sealing member may be disposed along a first edge of the display module (for example, the first edge 411 of FIG. 5A), a second edge (for example, the second edge 412 of FIG. 5A), and a third edge (for example, the third edge 413 of FIG. 5A).

In operation 2403, the display module may be seated on the side surface member (the support member or the housing). The display module may be bonded and fixed to a side surface member (for example, the support member 820 of FIG. 8) by the first sealing member and the second sealing member.

In operation 2404, the third sealing member may be injected to an empty space which is formed by an area by which the first sealing member and the fourth sealing member are spaced apart from each other, and a stepped portion formed between the second sealing member and the first sealing member. The support member may have an empty space formed between the first support portion (for example, the first support portion 8201 of FIG. 9A) and the second support portion (for example, the second support portion 8202 of FIG. 9A). For example, the support member may include an opening or a penetrating hole forming the empty space. The empty space may be a space that is surrounded by the first sealing member, the second sealing member, and the fourth sealing member. The third sealing member (for example, the third sealing member 950 of FIG. 9A) may be injected to fill the empty space formed by the first sealing member, the second sealing member, and the fourth sealing member. The first sealing member, the second sealing member, the third sealing member, and the fourth sealing member may form a closed space or a closed curve line, and can prevent and/or reduce foreign substances or moisture from entering the inside of the electronic device.

Referring to FIG. 25, in operation 2501, a display module and a side surface member (e.g., a housing) on which the display module is to be seated may be prepared. In operation 2502, a second sealing member may be disposed on a border of the display module. The second sealing member (for example, the second sealing member 460 of FIG. 4A) may be disposed along a first edge of a display 420 (for example, the first edge 411 of FIG. 5A), a second edge (for example, the second edge 412 of FIG. 5A), and a third edge (for example, the third edge 413 of FIG. 5A). The second sealing member may be disposed on a designated area of the display module along with the first sealing member, the fourth sealing member disposed on the display module in advance through operations 2302 and 2304 of FIG. 23.

In operation 2503, the third sealing member may be disposed in an empty space which is formed by an area by which the first sealing member and the fourth sealing member are spaced apart from each other, and a stepped portion formed between the second sealing member and the first sealing member. The empty space may be a space that is surrounded by the first sealing member, the second sealing member, and the fourth sealing member. The third sealing member 950 may be disposed in the empty space to fill the empty space formed by the first sealing member, the second sealing member, and the fourth sealing member. The third sealing member may form a waterproof structure of a closed curve line through coupling of the first sealing member, the second sealing member, and the fourth sealing member. The first sealing member, the second sealing member, the third sealing member, and the fourth sealing member forming a closed space or a closed curve line can prevent and/or reduce foreign substances or moisture from entering the inside of the electronic device.

In operation 2504, the display module may be seated on the side surface member (the support member or the housing). The display module may be bonded and fixed to the side surface member (for example, the support member 820 of FIG. 8) by the second sealing member 700 and the second sealing member 460.

According to various embodiments, an additional sealing member (for example, the fifth sealing member 955 of FIG. 9B) may be disposed to fill a gap between the display module and the housing. The fifth sealing member 955 may be disposed on the display module or the side surface member in operation 2501 of preparing the display module and the side surface member.

According to an example embodiment, an electronic device may include: a transparent front surface plate defining at least a portion of a front surface of the electronic device, the front surface plate including a first edge and a second edge disposed on opposite sides, a third edge connecting one end of the first edge and one end of the second edge, and a fourth edge connecting another end of the first edge and another end of the second edge disposed opposite the third edge; a rear surface plate defining at least a portion of a rear surface of the electronic device; a side housing surrounding at least a portion of a space between the front surface plate and the rear surface plate; a support disposed in the space and connected with the side surface housing or is integrally formed with the side surface housing; a display is disposed in the space and viewable through at least a portion of the front surface plate; a second flexible printed circuit board (FPCB) disposed to at least partially overlap the display when viewed above the front surface plate; a first FPCB connecting the display and the second FPCB, is the first FPCB being disposed in a folded state within a specified proximity of the fourth edge and having a portion overlapping the display when viewed above the front surface plate; a first seal disposed between the first FPCB and the support, or between the second FPCB and the support, the first seal extending from a first end to a second end along the fourth edge; a second seal disposed between the display and the support, and extending from a third end proximate the first end to a fourth end proximate the second end along the first edge, the third edge, and the second edge; and a third seal disposed between the first end of the first seal and the third end of the second sealing, and between the second end of the first seal and the fourth end of the second seal, and connecting the first seal and the second seal.

According to an example embodiment, the support may include a first opening at least partially overlapping a space between the first end of the first seal and the third end of the second seal when viewed above the rear surface plate, and a second opening at least partially overlapping a space between the second end of the first seal and the fourth end of the second seal, and the third seal may be disposed in the first opening and the second opening and is coupled to the support.

According to an example embodiment, when viewed above the rear surface plate, the first FPCB 1040 may protrude and may extend toward the third end of the second seal relative to the first end of the first seal, and may protrude and extend toward the fourth end of the second seal relative to the second end of the first seal.

According to an example embodiment, when viewed above the front surface plate, the first end of the first seal may protrude and may extend toward the third end of the second seal relative to the first FPCB, and the second end of the first seal may protrude and extend toward the fourth end of the second seal relative to the first FPCB 1040.

According to an example embodiment, the electronic device may further include a fourth sealing member 450 which is disposed between the first FPCB 1040 and the display 820, and overlaps the first sealing member 700 at least in part when viewed above the front surface plate 102.

According to an example embodiment, when viewed above the rear surface plate, the fourth seal may protrude and may extend toward the third end or the fourth end of the second seal relative to the first FPCB 1040 or the first seal.

According to an example embodiment, the first seal may include a photo-curable resin curable in reaction to light of a designated band.

According to an example embodiment, wherein, when viewed above the rear surface plate, the first sealing seal may be disposed between a coupling portion between the first FPCB and the second FPCB, and the fourth edge.

According to an example embodiment, when viewed above the rear surface plate, a coupling portion between the first FPCB and the second FPCB may be disposed between the first seal and the fourth edge.

According to an example embodiment, the electronic device may further include a seal covering the coupling portion between the first FPCB and the second FPCB.

According to an example embodiment, a coupling portion between the first FPCB and the second FPCB may be provided by anisotropic conducive film (ACF) bonding.

According to an example embodiment, the electronic device may further include: a display driver IC (DDI) disposed on the first FPCB; and a sheet disposed on the first FPCB to cover the DDI, and, when viewed above the rear surface plate, the sheet may be disposed to not overlap the first seal or may extend between the first FPCB and the first seal.

According to an example embodiment, the third end of the second seal may be positioned within a specified proximity of a connection portion where the first edge and the fourth edge of the front surface plate meet, and the fourth end of the second may be positioned within a specified proximity of a connection portion where the first edge and the third edge of the front surface plate meet.

According to an example embodiment, the first seal may further include a first coupling portion extending from the first end to the second end, and a second coupling portion comprising a material different from a first coupling material extending from the first end to the second end.

According to an example embodiment, a display may include: a first surface facing a first direction; a second surface facing a second direction; a display panel including includes a first edge having a first length, a second edge parallel to the first edge and having the first length, a third edge having a second length shorter than the first length, and a fourth edge parallel to the third edge and having the second length; a substrate attached to one surface of the display panel; an FPCB including an extension portion extending from at least a portion of an area of the substrate corresponding to the fourth edge, and is bent to face the second surface; a first seal disposed on a plane of the extension portion facing the second direction; and a fourth seal disposed between one area of the display adjacent to the fourth edge and the FPCB, and spaced apart from the first seal.

According to an embodiment, the display may further include: a DDI disposed on the FPCB; and a sheet disposed on the FPCB to cover the DDI, and the sheet may be disposed to not overlap the first seal, or extends between the FPCB and the first seal.

According to an example embodiment, an electronic device may include: a housing including a front surface plate facing a first direction, a rear surface plate facing a second direction opposite the first direction, and a side housing surrounding a space between the front surface plate and the rear surface plate; and a display disposed in the space and is viewable through at least a portion of the front surface plate, and includes a first edge having a first length, a second edge parallel to the first edge and having the first length, a third edge having a second length shorter than the first length, and a fourth edge parallel to the third edge and having the second length, the display including: a first surface facing the first direction; a second surface facing the second direction; and an FPCB including an extension portion extending from at least a portion of the fourth edge and bent into a space between the second surface and the rear surface plate; a first seal disposed between the extension portion and the side housing; a second seal extending along a length of the first edge, the second edge, and the third edge, and disposed between a first portion of the display and the side housing; a fourth seal extending lengthwise adjacent to the fourth edge, disposed between a second portion of the display and the FPCB, and spaced apart from the first seal; and a third filling at least a portion of a space between the first seal, and the second seal and the third seal.

According to an example embodiment, the first seal may comprise a photo-curable resin curable in reaction to light of a designated band.

According to an example embodiment, the electronic device may further include a DDI disposed on the FPCB.

According to an example embodiment, the electronic device may further include a sheet disposed on the FPCB to cover the DDI, and the sheet may be disposed to not overlap the first seal, or may extend between the FPCB and the first seal.

According to various example embodiments, the sealing structure of the electronic device can make it easy to extend a size of a display.

While the disclosure has been illustrated and described with reference to various example embodiments thereof, it will be understood that the various example embodiments are intended to illustrative, not limiting, and it will be further understood by those skilled in the art that various changes in form and details may be made therein without departing from the true spirit and full scope of the disclosure, including the appended claims.

What is claimed is:
1. An electronic device comprising:
a transparent front surface plate defining at least a portion of a front surface of the electronic device, and comprising a first edge and a second edge disposed on opposite sides, a third edge connecting one end of the first edge and one end of the second edge, and a fourth edge connecting another end of the first edge and another end of the second edge, the fourth edge being disposed opposite the third edge;
a rear surface plate defining at least a portion of a rear surface of the electronic device;
a side surface housing surrounding at least a portion of a space between the front surface plate and the rear surface plate;
a support disposed in the space and connected with the side housing or integrally formed with the side housing;
a display disposed in the space and viewable through at least a portion of the front surface plate;
a second flexible printed circuit board (FPCB) disposed to at least partially overlap the display when viewed above the front surface plate;
a first FPCB connecting the display and the second FPCB, and disposed in a folded state within a specified proximity of the fourth edge and having a portion overlapping the display when viewed above the front surface plate;
a first seal disposed between the first FPCB and the support, or between the second FPCB and the support, and extending from a first end to a second end along the fourth edge;
a second seal disposed between the display and the support, and extending from a third end proximate the first end to a fourth end proximate the second end along the first edge, the third edge, and the second edge; and
a third seal disposed between the first end of the first seal and the third end of the second seal, and between the second end of the first seal and the fourth end of the second seal, the third seal connecting the first seal and the second seal, wherein the support comprises:
a first opening at least partially overlapping a space between the first end of the first seal and the third end of the second seal when viewed above the rear surface plate, and
a second opening at least partially overlapping a space between the second end of the first seal and the fourth end of the second seal, and
wherein the third seal is disposed in the first opening and the second opening and is coupled to the support.

2. The electronic device of claim 1, wherein, when viewed above the rear surface plate, the first FPCB protrudes and extends toward the third end of the second seal relative to the first end of the first seal, and protrudes and extends toward the fourth end of the second seal relative to the second end of the first seal.

3. The electronic device of claim 1, wherein, when viewed above the front surface plate, the first end of the first seal protrudes and extends toward the third end of the second seal relative to the first FPCB, and the second end of the first seal protrudes and extends toward the fourth end of the second seal relative to the first FPCB.

4. The electronic device of claim 1, further comprising a fourth seal disposed between the first FPCB and the display, and at least partially overlapping the first seal when viewed above the front surface plate.

5. The electronic device of claim 4, wherein, when viewed above the rear surface plate, the fourth seal protrudes and extends toward the third end or the fourth end of the second seal relative to the first FPCB or the first seal.

6. The electronic device of claim 1, wherein the first seal comprises a photo-curable resin curable in reaction to light of a designated band.

7. The electronic device of claim 1, wherein a coupling portion between the first FPCB and the second FPCB comprises anisotropic conductive film (ACF).

8. The electronic device of claim 1, further comprising:
a display driver IC (DDI) disposed on the first FPCB; and
a sheet disposed on the first FPCB to cover the DDI,
wherein, when viewed above the rear surface plate, the sheet is disposed to not overlap the first seal or extends between the first FPCB and the first seal.

9. The electronic device of claim 1, wherein the third end of the second seal is positioned within a specified proximity of a connection portion where the first edge and the fourth edge of the front surface plate meet, and
wherein the fourth end of the second seal is positioned within a specified proximity of a connection portion where the first edge and the third edge of the front surface plate meet.

10. The electronic device of claim 1, wherein the first seal comprises a first coupling portion extending from the first end to the second end, and a second coupling portion including a material different from a material of the first coupling portion, extending from the first end to the second end.

11. An electronic device comprising:
a transparent front surface plate defining at least a portion of a front surface of the electronic device, and comprising a first edge and a second edge disposed on opposite sides, a third edge connecting one end of the first edge and one end of the second edge, and a fourth edge connecting another end of the first edge and another end of the second edge, the fourth edge being disposed opposite the third edge;
a rear surface plate defining at least a portion of a rear surface of the electronic device;
a side surface housing surrounding at least a portion of a space between the front surface plate and the rear surface plate;
a support disposed in the space and connected with the side housing or integrally formed with the side housing;
a display disposed in the space and viewable through at least a portion of the front surface plate;
a second flexible printed circuit board (FPCB) disposed to at least partially overlap the display when viewed above the front surface plate;
a first FPCB connecting the display and the second FPCB, and disposed in a folded state within a specified proximity of the fourth edge and having a portion overlapping the display when viewed above the front surface plate;
a first seal disposed between the first FPCB and the support, or between the second FPCB and the support, and extending from a first end to a second end along the fourth edge;
a second seal disposed between the display and the support, and extending from a third end proximate the first end to a fourth end proximate the second end along the first edge, the third edge, and the second edge; and
a third seal disposed between the first end of the first seal and the third end of the second seal, and between the second end of the first seal and the fourth end of the second seal, the third seal connecting the first seal and the second seal,
wherein, when viewed above the rear surface plate, the first seal is disposed between a coupling portion between the first FPCB and the second FPCB, and the fourth edge.

12. An electronic device comprising:
a transparent front surface plate defining at least a portion of a front surface of the electronic device, and comprising a first edge and a second edge disposed on opposite sides, a third edge connecting one end of the first edge and one end of the second edge, and a fourth edge connecting another end of the first edge and another end of the second edge, the fourth edge being disposed opposite the third edge;
a rear surface plate defining at least a portion of a rear surface of the electronic device;
a side surface housing surrounding at least a portion of a space between the front surface plate and the rear surface plate;
a support disposed in the space and connected with the side housing or integrally formed with the side housing;
a display disposed in the space and viewable through at least a portion of the front surface plate;
a second flexible printed circuit board (FPCB) disposed to at least partially overlap the display when viewed above the front surface plate;
a first FPCB connecting the display and the second FPCB, and disposed in a folded state within a specified proximity of the fourth edge and having a portion overlapping the display when viewed above the front surface plate;
a first seal disposed between the first FPCB and the support, or between the second FPCB and the support, and extending from a first end to a second end along the fourth edge;

a second seal disposed between the display and the support, and extending from a third end proximate the first end to a fourth end proximate the second end along the first edge, the third edge, and the second edge; and a third seal disposed between the first end of the first seal and the third end of the second seal, and between the second end of the first seal and the fourth end of the second seal, the third seal connecting the first seal and the second seal, wherein, when viewed above the rear surface plate, a coupling portion between the first FPCB and the second FPCB is disposed between the first seal and the fourth edge.

13. The electronic device of claim 12, further comprising a seal the coupling portion between the first FPCB and the second FPCB.

14. A display comprising:

a first surface facing a first direction;

a second surface facing a second direction;

a display panel comprising a first edge having a first length, a second edge parallel to the first edge and having the first length, a third edge having a second length shorter than the first length, and a fourth edge parallel to the third edge and having the second length;

a substrate attached to one surface of the display panel;

a flexible printed circuit board (FPCB) comprising an extension portion extending from at least a portion of an area of the substrate corresponding to the fourth edge, and is bent to face the second surface;

a first seal disposed on a plane of the extension portion facing the second direction and extending from a first end to a second end along the fourth edge; and a fourth seal adjacent to the fourth edge, disposed between one area of the display and the FPCB, and spaced apart from the first seal, wherein the first seal comprises a first coupling portion extending from the first end to the second end, and a second coupling portion including a material different from a material of the first coupling portion, extending from the first end to the second end.

15. The display of claim 14, further comprising:

a DDI disposed on the FPCB; and a sheet disposed on the FPCB to cover the DDI, wherein the sheet is disposed to not overlap the first seal, or extends between the FPCB and the first seal.

16. An electronic device comprising:

a housing comprising a front surface plate facing a first direction, a rear surface plate facing a second direction opposite the first direction, and a side housing surrounding a space between the front surface plate and the rear surface plate; and a display disposed in the space and viewable through at least a portion of the front surface plate, and comprising a first edge having a first length, a second edge parallel to the first edge and having the first length, a third edge having a second length shorter than the first length, and a fourth edge parallel to the third edge and having the second length, the display comprising: a first surface facing the first direction; a second surface facing the second direction; and a flexible printed circuit board (FPCB) comprising an extension portion extending from at least a portion of the fourth edge and bent into a space between the second surface and the rear surface plate;

a first seal disposed between the extension portion and the side housing;

a second seal extending lengthwise along the first edge, the second edge, and the third edge, and disposed between a first portion of the display and the side housing;

a fourth seal extending lengthwise adjacent to the fourth edge, disposed between a second portion of the display and the FPCB, at least partially overlapping the first seal when viewed above the front surface plate, and spaced apart from the first seal, and wherein when viewed above the rear surface plate, the fourth seal protrudes and extends toward a first end or a second end of the second seal relative to the FPCB or the first seal; and a third seal filling at least a portion of a space between the first seal and the second seal.

17. The electronic device of claim 16, wherein the first seal comprises a photo-curable resin curable in reaction to light of a designated band.

18. The electronic device of claim 16, further comprising a DDI disposed on the FPCB.

19. The electronic device of claim 18, further comprising a sheet disposed on the FPCB to cover the DDI, wherein the sheet is disposed to not overlap the first seal, or extends between the FPCB and the first seal.

* * * * *